United States Patent
Yu et al.

(10) Patent No.: US 7,801,234 B2
(45) Date of Patent: *Sep. 21, 2010

(54) DIGITAL BROADCASTING SYSTEM AND METHOD

(75) Inventors: Jung-pil Yu, Suwon-si (KR); Eul-jun Park, Seoul (KR); Yong-sik Kwon, Seoul (KR); Yong-deok Chang, Suwon-si (KR); Hae-joo Jeong, Seoul (KR); Joon-soo Kim, Seoul (KR); Jin-Hee Jeong, Anyang-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1016 days.

This patent is subject to a terminal disclaimer.

(21) Appl. No.: 11/504,725

(22) Filed: Aug. 16, 2006

(65) Prior Publication Data

US 2007/0092032 A1    Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006   (KR) .................... 10-2006-0068067

(51) Int. Cl.
*H04L 5/12* (2006.01)

(52) U.S. Cl. ...................................... 375/265; 375/295
(58) Field of Classification Search ................. 375/260, 375/265, 295, 341
See application file for complete search history.

(56) References Cited

U.S. PATENT DOCUMENTS

| | | | |
|---|---|---|---|
| 2003/0039318 A1* | 2/2003 | Tong et al. | 375/298 |
| 2003/0099303 A1 | 5/2003 | Birru et al. | |
| 2003/0103575 A1 | 6/2003 | Birru et al. | |
| 2003/0235166 A1* | 12/2003 | Son et al. | 370/334 |

(Continued)

OTHER PUBLICATIONS

Wayne E. Bretl et al., "Enhanced VSB System," *IEEE Transactions on Consumer Electronics*, vol. 48, No. 3, Aug. 2002, pp. 533-538.

(Continued)

*Primary Examiner*—Emmanuel Bayard
(74) *Attorney, Agent, or Firm*—Sughrue Mion, PLLC

(57) ABSTRACT

A digital broadcasting system includes: a transmission stream generator multiplexing a normal stream and a turbo stream to generate a dual transmission stream; a transmitter inserting a supplementary reference signal (SRS) into the dual transmission stream, processing the turbo stream to reconstitute the dual transmission stream, and outputting the reconstituted dual transmission stream; and a receiver receiving the reconstituted dual transmission stream and decoding the normal stream and the turbo stream to restore normal stream data and turbo stream data. Thus, reception performance of a digital broadcasting signal can be efficiently improved.

47 Claims, 15 Drawing Sheets

U.S. PATENT DOCUMENTS

2004/0028076 A1    2/2004   Strolle et al.
2007/0092027 A1*   4/2007   Yu et al. ..................... 375/295

OTHER PUBLICATIONS

Seung-Won Kim et al., "Enhanced-xVSB System Development for Mobile/Portable Reception," *IEEE Transactions on Consumer Electronics,* vol. 51, No. 2, May 2005, pp. 419-423.

International Search Report mailed on Feb. 5, 2007, in International Application No. PCT/KR2006/004318.

Written Opinion of the International Searching Authority mailed on Feb. 5, 2007, in International Application No. PCT/KR2006/004318.

U.S. Appl. No. 11/416,254, filed May 3, 2006, Jung-pil Yu et al., Samsung Electronics Co., Ltd.

U.S. Appl. No. 11/416,258, filed May 3, 2006, Yong-sik Kwon et al., Samsung Electronics Co., Ltd.

U.S. Appl. No. 11/416,457, filed May 3, 2006, Jung-pil Yu et al., Samsung Electronics Co., Ltd.

U.S. Appl. No. 11/503,970, filed Aug. 15, 2006, Jung-pil Yu et al., Samsung Electronics Co., Ltd.

U.S. Appl. No. 11/504,024, filed Aug. 15, 2006, Jung-pil Yu et al., Samsung Electronics Co., Ltd.

U.S. Appl. No. 11/504,027, filed Aug. 15, 2006, Jung-pil Yu et al., Samsung Electronics Co., Ltd.

U.S. Appl. No. 11/504,029, filed Aug. 15, 2006, Jung-pil Yu et al., Samsung Electronics Co., Ltd.

U.S. Appl. No. 11/504,030, filed Aug. 15, 2006, Jung-pil Yu et al., Samsung Electronics Co., Ltd.

U.S. Appl. No. 11/504,031, filed Aug. 15, 2006, Jung-pil Yu et al., Samsung Electronics Co., Ltd.

U.S. Appl. No. 11/504,038, filed Aug. 15, 2006, Jung-pil Yu et al., Samsung Electronics Co., Ltd.

U.S. Appl. No. 11/504,651, filed Aug. 16, 2006, Jung-pil Yu et al., Samsung Electronics Co., Ltd.

* cited by examiner

Expansion by 4 (1byte → 4bytes)

| SYNC | PID | AF Header | SRS | Turbo Data |
|------|-----|-----------|-----|------------|
| SYNC | PID | AF Header | SRS | Normal Data |
| SYNC | PID | AF Header | SRS | Normal Data |
| SYNC | PID | AF Header | SRS | Normal Data |
| 1 | 3 | 2 | S | 182-S |

DIGITAL BROADCASTING SYSTEM AND METHOD

CROSS-REFERENCE TO RELATED APPLICATIONS

This application claims priority from U.S. Provisional Application No. 60/728,777, filed on Oct. 21, 2005, U.S. Provisional Application No. 60/734,295 filed on Nov. 8, 2005, U.S. Provisional Application No. 60/738,050 filed on Nov. 21, 2005, U.S. Provisional Application No. 60/739,448 filed on Nov. 25, 2005, and U.S. Provisional Application No. 60/788,707 filed on Apr. 4, 2006, and Korean Patent Application No. 2006-68067, filed in the Korean Intellectual Property Office on Jul. 20, 2006, the disclosures of which are incorporated herein by reference.

BACKGROUND OF THE INVENTION

1. Field of the Invention

Aspects of the present invention relate to digital broadcasting system and method using a dual transmission stream including a normal stream and a turbo stream for digital broadcasting. More particularly, aspects of the present invention relate to digital broadcasting system and method for enhancing a digital broadcasting performance by generating, transmitting and receiving a dual transmission stream including a normal stream and/or a robust-processed turbo stream so as to improve a reception performance of ATSC VSB system which is a terrestrial DTV system in the United States of America (U.S.A).

2. Description of the Related Art

An Advanced Television Systems Committee Vestigial Sideband (ATSC VSB) way, which is a United States terrestrial digital television (DTV) system, is a single carrier method and uses field syncs each having 312 segments. Thus, reception performance is poor in a poor channel, particularly, in a Doppler fading channel.

FIG. 1 is a block diagram of a digital broadcasting transmitting and receiving system according to standards of an Advanced Television Systems Committee Digital Television (ATSC DTV) as a general United States terrestrial digital broadcasting system. The digital broadcasting transmitter of the digital broadcasting transmitting and receiving system shown in FIG. 1 is an enhanced Vestigial Sideband (EVSB) system suggested by PHILIPS. The systems forms and transmits a dual stream including normal data of a standard ATSC VSB system to which robust data is added.

Referring to FIG. 1, the digital broadcasting transmitter includes a randomizer 11, a Reed-Solomon (RS) encoder 12, an interleaver 13, and a trellis encoder 14 to perform error correction coding (ECC) on the dual stream. The randomizer 11 randomizes the dual stream. The RS encoder 12 is a concatenated coder adding parity bytes to a transmission stream to correct an error occurring in a transmission process due to channel characteristics. The interleaver 13 interleaves RS encoded data according to a predetermined pattern. The trellis encoder 14 trellis encodes the interleaved data in a rate of ⅔ to map the interleaved data as 8-level symbols.

The digital broadcasting transmitter further includes a multiplexer 15 and a modulator 16. The multiplexer 15 inserts field syncs and segment syncs into data on which ECC has been performed as in a data format shown in FIG. 2. The modulator 16 adds a predetermined direct current (DC) value to data symbols into which segment sync signals and field sync signals have been inserted. This inserts pilot tones and shapes pulses so as to perform a VSB modulation on the data symbols and up-coverts the data symbols into a signal in a radio frequency (RF) channel band. Thus, in the digital broadcasting transmitter, normal data and robust data are multiplexed and input to the randomizer 11 using a dual stream method of transmitting normal data and robust data through a channel.

The input data is randomized by the randomizer 11, outer encoded by the RS encoder 12 as an outer coder, and interleaved by the interleaver 13. Also, the interleaved data is inner encoded by the trellis encoder 14 in the unit of 12 symbols and is mapped as 8-level symbols. Next, field sync signals and segment sync signals are inserted into the 8-level symbols. Pilot tones are inserted into the 8-level symbols to perform a VSB modulation on the 8-level symbols, up-covert the 8-level symbols into an RF signal, and transmit the RF signal.

The digital broadcasting receiver of the digital broadcasting transmitting and receiving system shown in FIG. 1 includes a tuner (not shown), a demodulator 21, an equalizer 22, a viterbi decoder 23, a deinterleaver 24, an RS decoder 25, and a derandomizer 26. The tuner converts the RF signal received through a channel into a baseband signal. The demodulator 21 detects sync signals from the baseband signal and demodulates the baseband signal. The equalizer 22 compensates for a channel distortion of the demodulated signal caused by a multi-path. The viterbi decoder 23 performs ECC on the equalized signal and demodulates the equalized signal into symbol data. The deinterleaver 24 re-arranges the data interleaved by the interleaver 13 of the digital broadcasting transmitter. The RS decoder 25 performs an error correction on the re-arranged data. The derandomizer 26 derandomizes the data error corrected by the RS decoder 25 and outputs a Moving Picture Experts Group-2 (MPEG-2) transmission stream. Accordingly, the digital broadcasting receiver shown in FIG. 1 performs a reverse process to a process performed by the digital broadcasting transmitter. In other words, the broadcasting receiver down-converts the RF signal into the baseband signal, demodulates and equalizes the baseband signal, and channel decodes the demodulated and equalized signal so as to restore an original signal.

FIG. 2 is a view illustrating a VSB data frame of a United States digital broadcasting (8-VSB) system into which segment sync signals and field sync signals are inserted. As shown in FIG. 2, one frame includes two fields. One of the two fields includes a field sync segment as a first segment and 312 data segments. Also, in the VSB data frame, one segment corresponds to an MPEG-2 packet and includes a segment sync having 4 symbols and 828 data symbols. Referring to FIG. 2, a segment sync signal as a sync signal and a field sync signal are used for synchronization and equalization in the digital broadcasting receiver. In other words, a field sync signal and a segment sync signal are known between the digital broadcasting transmitter and the digital broadcasting receiver and used as reference signals for the equalization in the digital broadcasting receiver.

In the United States terrestrial broadcasting system shown in FIG. 1, robust data is added to normal data of an existing ATSC VSB system to form and transmit a dual stream. Here, existing normal data is transmitted together with robust data. However, in the United States terrestrial digital broadcasting system shown in FIG. 1, although the dual stream is transmitted with the addition of the robust data, reception performance of a multi-path channel is hardly improved from that of using a normal data stream. In other words, the improvement of a normal stream hardly contributes to improving the reception performance. Also, a turbo stream cannot greatly contribute to improving reception performance in a multi-path environment. Thus, a broadcasting system capable of improving reception performance of a dual transmission stream including a turbo stream and a normal stream is required.

SUMMARY OF THE INVENTION

Accordingly, aspects of the present invention provide digital broadcasting system and method capable of improving reception performance of an Advanced Television Systems Committee Vestigial Sideband (ATSC VSB) method as a United States terrestrial digital television (DTV) system.

According to an aspect of the present invention, there is provided a digital broadcasting system including: a transmission stream generator multiplexing a normal stream and a turbo stream to generate a dual transmission stream; a transmitter inserting a supplementary reference signal (SRS) into the dual transmission stream, processing the turbo stream to reconstitute the dual transmission stream, and outputting the reconstituted dual transmission stream; and a receiver receiving the reconstituted dual transmission stream and separately decoding the normal stream and the turbo stream to restore normal stream data and turbo stream data.

According to an aspect of the present invention, the transmission stream generator includes: a Reed-Solomon (RS) encoder receiving the turbo stream from an external source and RS encoding the turbo stream; a duplicator forming a parity insertion area in the RS encoded turbo stream; and a multiplexer receiving the normal stream from an external source and multiplexing the turbo stream processed by the duplicator and the normal stream to generate the dual transmission stream.

According to an aspect of the present invention, the duplicator converts each byte of the turbo stream using a ½ rate conversion method or a ¼ rate conversion method to form the parity insertion area between data bits of the turbo stream.

According to an aspect of the present invention, the transmitter includes: a randomizer receiving the dual transmission stream from the transmission stream generator and randomizing the dual transmission stream; an SRS inserter inserting an SRS into a stuff area formed in the randomized dual transmission stream; an RS encoder encoding the dual transmission stream into which the SRS has been inserted; an interleaver interleaving the RS encoded dual transmission stream; a turbo processor detecting the turbo stream from the interleaved dual transmission stream, encoding the detected turbo stream, stuffing the encoded turbo stream into the dual transmission stream, and compensating for parity corresponding to the encoded turbo stream; and a trellis and/or parity corrector trellis encoding the dual transmission stream processed by the turbo processor.

According to an aspect of the present invention, the turbo processor includes: a turbo stream detector detecting the turbo stream from the interleaved dual transmission stream; an outer encoder inserting parity corresponding to the detected turbo stream into the parity insertion area of the turbo stream; an interleaver interleaving the turbo stream into which the parity has been inserted; a turbo stream stuffer inserting the interleaved turbo stream into the dual transmission stream to reconstitute the dual transmission stream; and a parity compensator regenerating parity of the reconstituted dual transmission stream and adding the parity to the dual transmission stream.

According to an aspect of the present invention, the turbo processor further includes: a byte-symbol converter converting the interleaved dual transmission stream from a byte unit into a symbol unit; and a symbol-byte converter converting the dual transmission stream including the parity regenerated by the parity compensator from a symbol unit into a byte unit.

According to an aspect of the present invention, the transmitter further includes: a multiplexer adding a sync signal to the trellis encoded dual transmission stream; a pilot inserter inserting a pilot into the dual transmission stream to which the sync signal has been added; a pre-equalizer equalizing the dual transmission stream into which the pilot has been inserted; a VSB modulator VSB modulating the equalized dual transmission stream; and a radio frequency (RF) modulator modulating the VSB modulated dual transmission stream into a signal in an RF channel band and transmitting the signal.

According to an aspect of the present invention, the trellis and/or parity corrector perform an initialization before encoding the SRS and compensate for the parity according to a value changed by the initialization.

According to an aspect of the present invention, the trellis and/or parity corrector includes: a trellis encoder block performing the initialization and outputting a pre-stored values as an initial value if an external control signal corresponding to an initialization section is received; an RS re-encoder generating parity corresponding to the initial value; an adder adding the parity generated by the RS re-encoder to the dual transmission stream to correct parity of the dual transmission stream; a multiplexer providing the dual transmission stream including the parity corrected by the adder to the trellis encoder block; and a map symbol mapping and outputting the dual transmission stream trellis encoded by the trellis encoder block.

According to an aspect of the present invention, the trellis encoder block includes: a plurality of trellis encoders; a splitter sequentially inputting the dual transmission stream into the plurality of trellis encoders; and an encoding output unit sequentially detecting values encoded by the plurality of trellis encoders.

According to an aspect of the present invention, each of the plurality of trellis encoders includes: a first memory initialized and outputting a pre-stored value as a first initial value if the external control signal is input; a second memory; and a third memory initialized to shift a pre-stored value to the second memory so as to output the value pre-stored in the second memory as a second initial value if the external control signal is input, wherein the RS re-encoder generates parity corresponding to an initial value including a combination of the first and second initial values.

According to an aspect of the present invention, the receiver includes: a demodulator receiving and demodulating the dual transmission stream; an equalizer equalizing the demodulated dual transmission stream; a first processor restoring normal stream data from the equalized dual transmission stream; and a second processor restoring turbo stream data from the equalized dual transmission stream.

According to an aspect of the present invention, the first processor includes: a viterbi decoder performing error correction on the normal stream of the equalized dual transmission stream and decoding the error corrected normal stream; a first deinterleaver deinterleaving the dual transmission stream output from the viterbi decoder; an RS decoder RS decoding the deinterleaved dual transmission stream; and a first derandomzer derandomizing the RS decoded dual transmission stream to restore the normal stream data.

According to an aspect of the present invention, the second processor includes: a turbo decoder turbo decoding the turbo stream of the equalized dual transmission stream; a second deinterleaver deinterleaving the dual transmission stream including the turbo decoded turbo stream; a parity remover removing parity from the dual transmission stream deinterleaved by the second deinterleaver; a second randomizer derandomizing the dual transmission stream from which the parity has been removed; and a turbo demultiplexer demultiplexing the derandomized dual transmission stream to restore the turbo stream data.

According to an aspect of the present invention, the turbo decoder includes: a trellis decoder trellis decoding the turbo stream of the equalized dual transmission stream; an outer deinterleaver deinterleaving the trellis decoded turbo stream; an outer map decoder decoding the deinterleaved turbo stream; an outer interleaver interleaving the turbo stream decoded by the outer map decoder and providing the interleaved turbo stream to the trellis decoder if the outer map decoder outputs a soft decision output value; and a frame formatter frame formatting a hard decision output value output from the outer map decoder.

According to an aspect of the present invention, the turbo decoder further includes a symbol deinterleaver converting the frame formatted turbo stream from a symbol unit into a byte unit and providing the turbo stream to the turbo inserter.

According to another aspect of the present invention, there is provided a digital broadcasting method including: multiplexing a normal stream and a turbo stream to generate a dual transmission stream; inserting an SRS into the dual transmission stream, processing the turbo stream to reconstitute the dual transmission stream, and outputting the reconstituted dual transmission stream; and receiving the reconstituted dual transmission stream and decoding the normal stream and the turbo stream to restore normal stream data and turbo stream data.

According to an aspect of the present invention, the multiplexing of the normal stream and the turbo stream to generate the dual transmission stream includes: receiving the turbo stream from an external source and RS encoding the turbo stream; forming a parity insertion area in the RS encoded turbo stream; and receiving the normal stream from an external source and multiplexing the turbo stream including the parity insertion area and the normal stream to generate the dual transmission stream.

According to aspects of the present invention, each byte of the turbo stream is converted using a ½ rate conversion method or a ¼ rate conversion method to form the parity insertion area between data bits of the turbo stream.

According to an aspect of the present invention, the inserting of the SRS into the dual transmission stream, processing the turbo stream to reconstitute the dual transmission stream, and the outputting of the reconstituted dual transmission stream includes: randomizing the generated dual transmission stream; inserting the SRS into a stuff area formed in the randomized dual transmission stream; encoding the dual transmission stream into which the SRS has been inserted; interleaving the encoded dual transmission stream; detecting the turbo stream from the interleaved dual transmission stream, encoding the turbo stream, stuffing the encoded turbo stream into the dual transmission stream, and compensating for parity corresponding to the encoded turbo stream; and trellis encoding the turbo processed dual transmission stream.

According to an aspect of the present invention, the detecting of the turbo stream from the interleaved dual transmission stream, the encoding of the turbo stream, the stuffing of the encoded turbo stream into the dual transmission stream, and the compensating for the parity corresponding to the encoded turbo stream includes: detecting the turbo stream from the interleaved dual transmission stream; inserting parity corresponding to the detected turbo stream into the parity insertion area of the turbo stream; interleaving the turbo stream into which the parity has been inserted; inserting the interleaved turbo stream into the dual transmission stream to reconstitute the dual transmission stream; and regenerating parity of the reconstituted dual transmission stream and adding the parity to the dual transmission stream.

According to an aspect of the present invention, the detecting of the turbo stream from the interleaved dual transmission stream, the encoding of the turbo stream, the stuffing of the encoded turbo stream into the dual transmission stream, and the compensating for the parity corresponding to the encoded turbo stream further includes: converting the interleaved dual transmission stream from a byte unit into a symbol unit; and converting the dual transmission stream including the regenerated parity from a symbol unit into a byte unit.

According to an aspect of the present invention, the inserting of the SRS into the dual transmission stream, processing the turbo stream to reconstitute the dual transmission stream, and the outputting of the reconstituted dual transmission stream further includes: adding a sync signal to the trellis encoded dual transmission stream; inserting a pilot into the dual transmission stream to which the sync signal has been added; equalizing the dual transmission stream into which the pilot has been inserted; VSB modulating the equalized dual transmission stream; and modulating the VSB modulated dual transmission stream into a signal in an RF channel band and transmitting the signal.

According to an aspect of the present invention, an initialization is performed before the SRS is encoded, and/or the parity is compensated for according to a value changed by the initialization.

According to an aspect of the present invention, the receiving of the reconstituted dual transmission stream and the decoding of the normal stream and the turbo stream to restore the normal stream data and the turbo stream data includes: receiving and demodulating the dual transmission stream; equalizing the demodulated dual transmission stream; restoring the normal stream data from the equalized dual transmission stream; and restoring the turbo stream data from the equalized dual transmission stream.

According to an aspect of the present invention, the restoring of the normal stream data from the equalized dual transmission stream includes: performing error correction on the normal stream of the equalized dual transmission stream and decoding the error corrected normal stream; deinterleaving the demodulated dual transmission stream; RS decoding the deinterleaved dual transmission stream; and derandomizing the RS decoded dual transmission stream to restore the normal stream data.

According to an aspect of the present invention, the restoring of the turbo stream data from the equalized dual transmission stream includes: turbo decoding the turbo stream of the equalized dual transmission stream; deinterleaving the dual transmission stream including the turbo decoded turbo stream; removing parity from the deinterleaved dual transmission stream; derandomizing the dual transmission stream from which the parity has bee removed; and demultiplexing the derandomized dual transmission stream to restore the turbo stream data.

According to an aspect of the present invention, the turbo decoding of the turbo stream of the equalized dual transmission stream includes: trellis decoding the turbo stream of the equalized dual transmission stream using a trellis decoder; deinterleaving the trellis decoded turbo stream; decoding the deinterleaved turbo stream; if a soft decision output value is output, interleaving the decoded turbo stream and providing the interleaved turbo stream to the trellis decoder; if a hard decision output value is output, frame formatting the hard decision output value to output the dual transmission stream.

According to an aspect of the present invention, the turbo decoding of the turbo stream of the equalized dual transmission stream further includes converting the frame formatted turbo stream from a symbol unit into a byte unit.

BRIEF DESCRIPTION OF THE DRAWINGS

The above and other aspects and/or features of the present invention will be more apparent and more readily appreciated by describing certain embodiments of the present invention with reference to the accompanying drawings, in which.

DETAILED DESCRIPTION OF THE EMBODIMENTS

Figure 1:
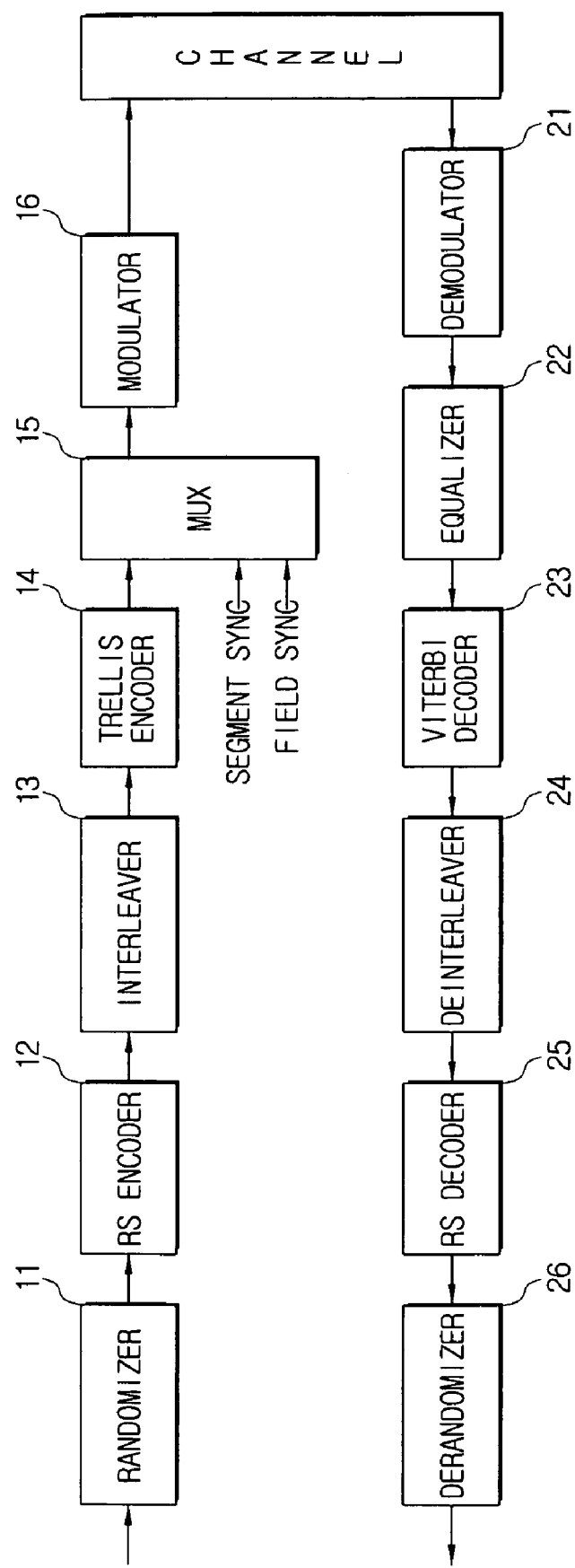
FIG. 1 is a block diagram illustrating a configuration of a conventional digital broadcasting (ATSC VSB) transmitting and receiving system.
Figure 2:
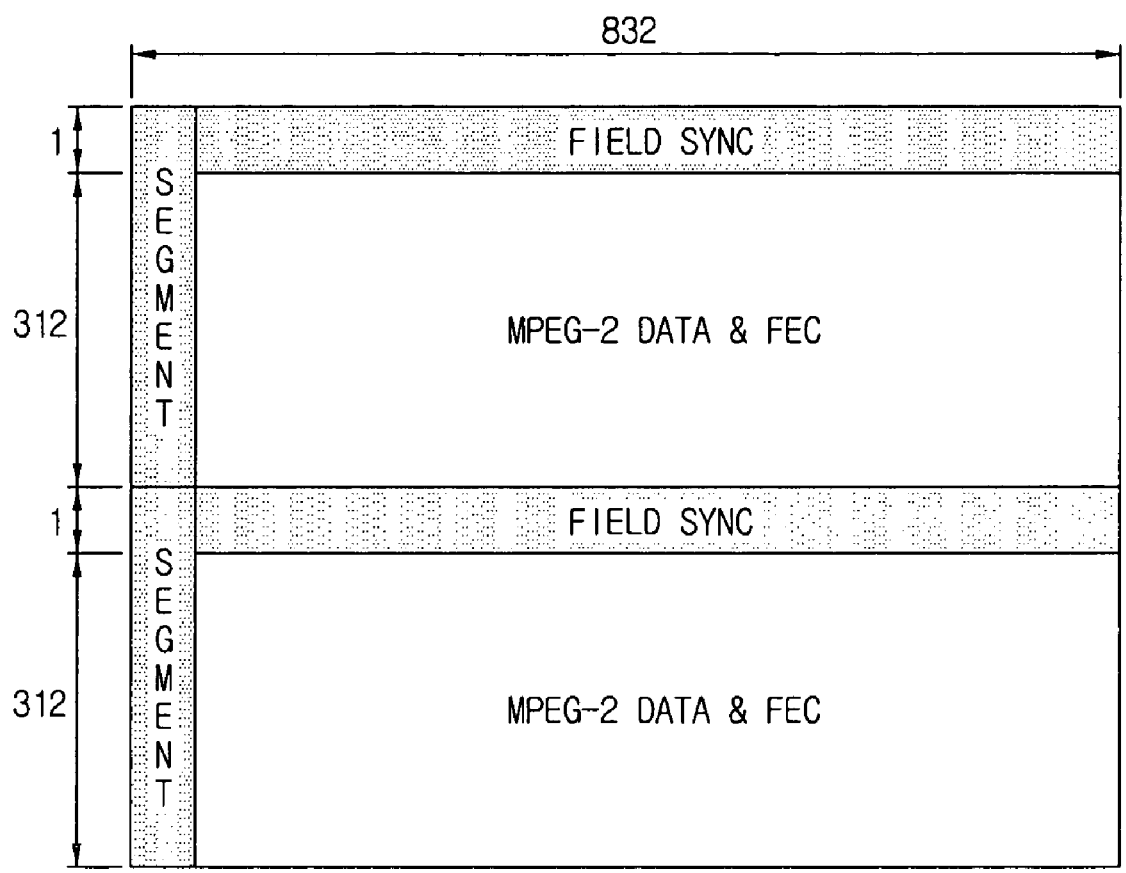
FIG. 2 is a view illustrating a frame structure of conventional Advanced Television Systems Committee Vestigial Sideband (ATSC VSB) data.

Certain embodiments of the present invention will be described in greater detail with reference to the accompanying drawings. In the following description, same drawing reference numerals are used for the like elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
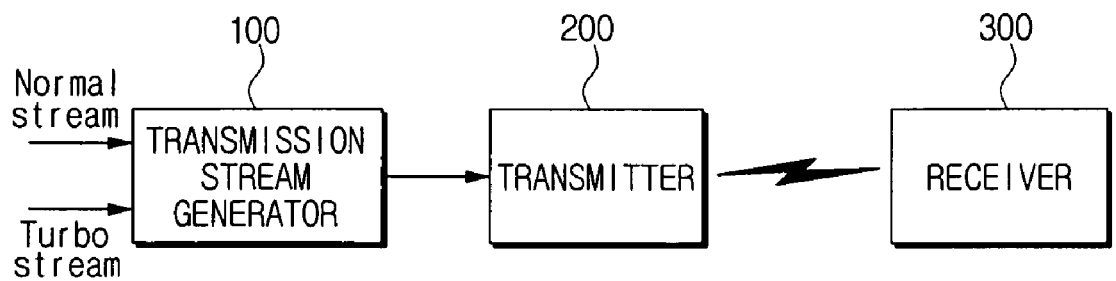
FIG. 3 is a block diagram illustrating a configuration of a digital broadcasting system according to an embodiment of the present invention.

FIG. 3 is a block diagram illustrating a configuration of a digital broadcasting system according to an embodiment of the present invention. Referring to FIG. 3, the digital broadcasting system includes a transmission stream generator 100, a transmitter 200, and a receiver 300. The transmission stream generator 100 receives and multiplexes a normal stream and a turbo stream to generate a dual transmission stream.

Figure 4:
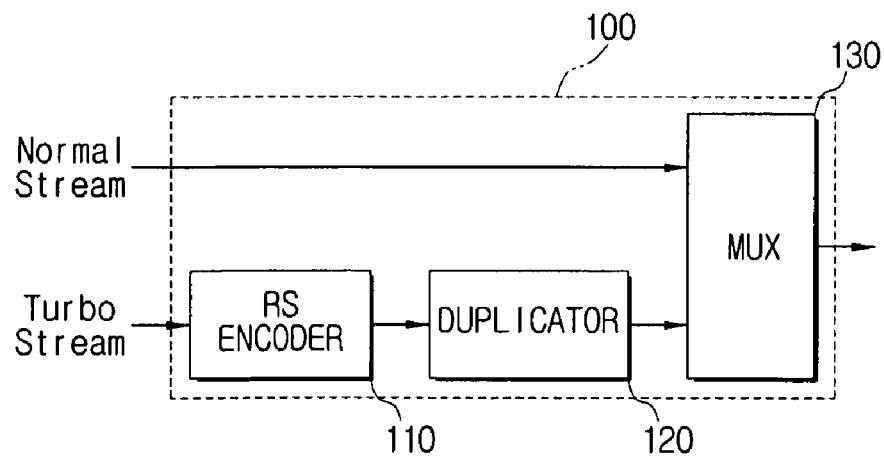
FIG. 4 is a block diagram illustrating a configuration of a transmission stream generator of the digital broadcasting system shown in FIG. 3, according to an embodiment of the present invention.

FIG. 4 is a block diagram illustrating a configuration of the transmission stream generator 100 shown in FIG. 4, according to an embodiment of the present invention. Referring to FIG. 4, the transmission stream generator 100 includes an RS encoder 110, a duplicator 120, and a multiplexer 130. The RS encoder 110 receives the turbo stream, adds parity to the turbo stream, encodes the turbo stream, and transmits the encoded turbo stream to the duplicator 120. The multiplexer 130 multiplexes the normal stream with the duplicated and encoded turbo stream to generate the dual transmission stream received at the transmitter 200.

Figure 5:
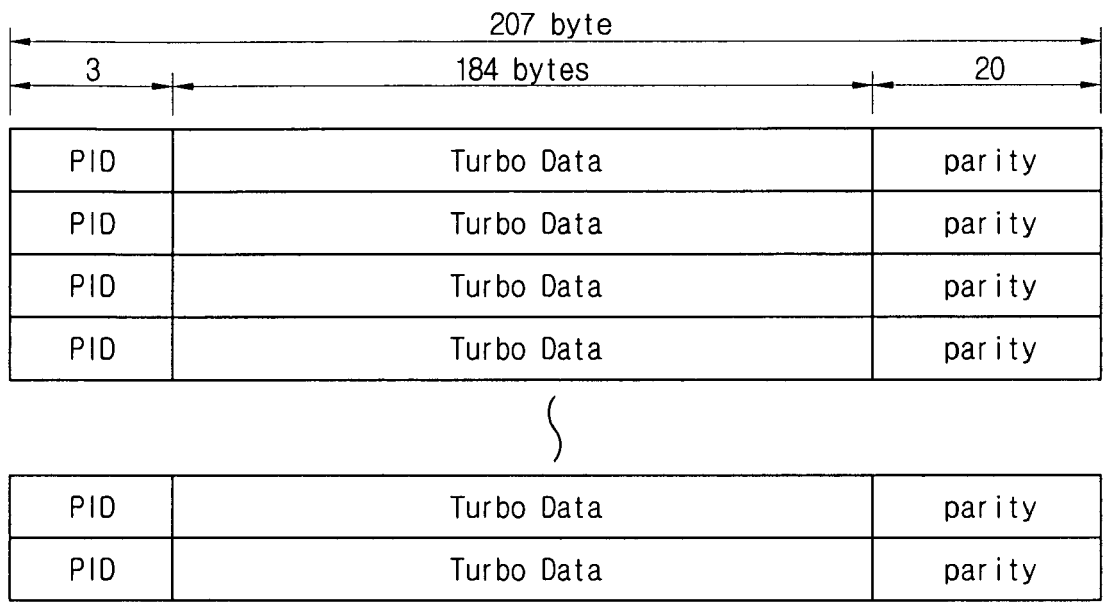
FIG. 5 is a view illustrating a structure of a stream output from an RS encoder of the transmission stream generator shown in FIG. 3, according to an embodiment of the present invention.

FIG. 5 is a view illustrating a structure of a packet encoded by the RS encoder 110 shown in FIG. 4. The RS encoder 110 shown in FIG. 4 receives the turbo stream including a sync signal area, a packet identity (PID) area, and a turbo data area. The shown whole turbo stream packet has 188 bytes, but may have other byte values.

As shown, a sync signal is 1 byte, PID is 3 bytes, and turbo data is 184 bytes. The RS encoder 110 removes the sync signal from the turbo stream, computes parity of the turbo data area, and adds parity of 20 bytes to the turbo stream. As a result, a packet of the finally encoded turbo stream includes 207 bytes. Here, 3 bytes of 207 bytes are allocated to the PID, 184 bytes are allocated to turbo data, and 20 bytes are allocated to parity. However, it is understood that other byte values can be used in other aspects, and that the packet can have additional elements instead of or in addition to the shown packet elements.

The duplicator 120 forms parity insertion areas in the encoded turbo stream. A method of forming the parity insertion area will now be described in detail. Bytes of the turbo stream are divided into groups each having 2 bytes or 4 bytes according to a preset expansion rate. A portion of bit values of one byte and null data (e.g., "0") are put into each of the groups. Areas into which null data is input are the parity insertion areas. However, it is understood that for other rates, the groups can be of other sizes.

The operation of the duplicator 120 will now be described in more detail. By way of example, if an input is increased to two times at a ½ rate as shown in FIG. 6 and "a, b, c, d, e, f, g, h" are inserted into one byte in order from most significant bits (MSB), an output of the duplicator 120 is expressed as "a, a, b, b, c, c, d, d, e, e, f, f, g, g, h, h." In this example, one byte including MSBs "a, a, b, b, c, c, d, d," and one byte including bits "e, e, f, f, g, g, h, h" are sequentially output.

Figure 7:
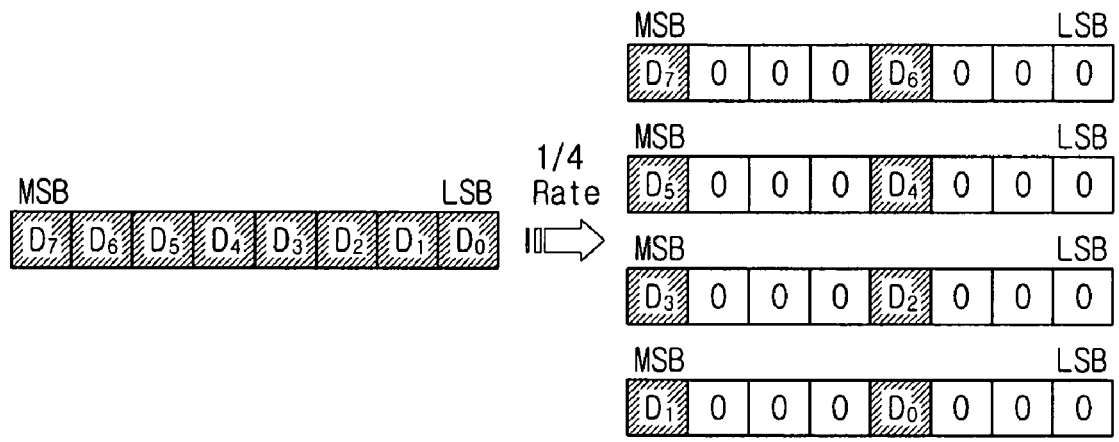
FIG. 7 illustrates a process of generating parity insertion areas using the transmission stream generator shown in FIG. 4, according to an embodiment of the present invention.

In contrast, if an input is increased to four times at a ½ rate as shown in FIG. 7, an output of the duplicator 120 is expressed as "a, a, a, a, b, b, b, b, c, c, c, c, d, d, d, d, e, e, e, e, f, f, f, f, g, g, g, g, h, h, h, h." In other words, 4 bytes are output. The duplicator 120 does not need to necessarily duplicate input bits, but may insert a different arbitrary value (i.e., null data) into other positions except designated positions. For example, if the duplicator 120 increases an input to two times, the duplicator 120 may output "a, x, b, x, c, x . . . " instead of "a, a, b, b, c, c, . . . " In other words, the duplicator 120 may maintain an original input value only in a fore part of each of two consecutive bits, but may put an arbitrary value into a back part of each of the two consecutive bits.

In another aspect of the invention, the duplicator 120 maintains an original value only in the back part of the resulting output. If the duplicator 120 increases an output to four times, an original input would be put only into one of first through fourth positions, and an arbitrary value may be put into the other expanded positions added by the duplicator 120 in other aspect of the invention.

Figure 6:
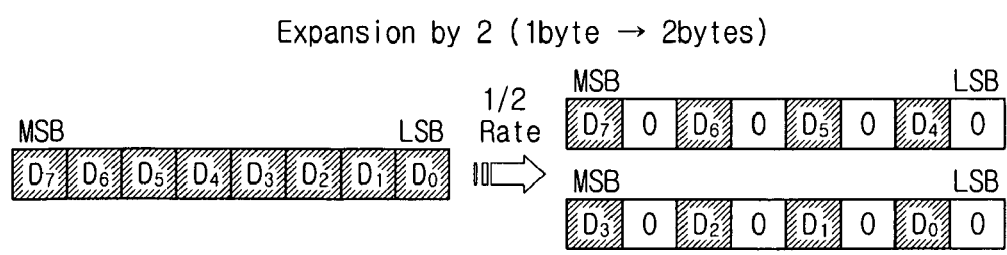
FIG. 6 illustrates a process of generating parity insertion areas using the transmission stream generator shown in FIG. 4, according to an embodiment of the present invention.

FIGS. 6 and 7 are views illustrating a method of forming parity insertion areas using the duplicator 120, according to embodiments of the present invention. FIG. 6 illustrates a ½ rate conversion method. The duplicator 120 adopts a ½ rate conversion method to each byte of a turbo stream to generate two bytes. As shown in FIG. 6, one byte including bits $D_0$ through $D_7$ is divided into two bit groups. One of the two bit groups includes 4 bits $D_0$ through $D_3$, and the other one includes 4 bits $D_4$ through $D_7$. In this state, one null bit is arranged with each bit of each of the two bit groups to expand each of the two bit groups to a byte. As a result, a first byte "D7 0 D6 0 D5 0 D4 0" including bits $D_4$ through $D_7$ and a second byte "D3 0 D2 0 D1 0 D0 0" including $D_0$ through $D_3$ are generated. A bit between two bits of each of the first and second bytes is used as a parity insertion area. In other words, second, fourth, sixth, and zeroth bits of each of the first and second bytes are used as parity insertion areas. However, it is understood that the positions of such parity insertion areas may vary from that shown in FIG. 6. By way of example, second, third, sixth, and seventh bits or third, fourth, fifth, and sixth bits may be used as parity insertion areas in other aspects of the invention.

FIG. 7 illustrates a ¼ rate conversion method. The duplicator 120 adopts a ¼ rate conversion method to each byte of the turbo stream to generate four bytes. Referring to FIG. 7, one byte including bits $D_0$ through $D_7$ is divided into four bit groups each having two bits $D_0$ and $D_1$, $D_2$ and $D_3$, $D_4$ and $D_5$, or $D_6$ and $D_7$. In this state, three null bits are arranged in a line next to each bit of each of the four bit groups to expand each of the four bit groups to a byte. In detail, one byte is expanded to a first byte "D7 0 0 0 D6 0 0 0" including $D_6$ and $D_7$, a second byte "D5 0 0 0 D4 0 0 0" including $D_4$ and $D_5$, a third byte "D3 0 0 0 D2 0 0 0" including $D_2$ and $D_3$, and a fourth byte "D1 0 0 0 D0 0 0 0" including $D_0$ and $D_1$. Referring to FIG. 7, zeroth, first, and second, and fourth, fifth, and sixth bits of each of the four bit groups are used as parity insertion areas, but parity insertion areas are limited to this case and can be otherwise configured in the byte.

Referring to FIG. 4, the multiplexer 130 multiplexes the normal stream additionally received and the turbo stream processed by the duplicator 120. Thus, a dual transmission stream including the normal stream and the turbo stream is generated. While not required in all aspects, the normal stream and the turbo stream may be received from an external module such as a broadcast shooting apparatus or the like, and/or an internal module such as a compression processing module (e.g., a Moving Picture Experts Group-2 (MPEG-2) module, a video encoder, an audio encoder, or the like).

The multiplexer 130 forms an adaptation field in each packet of the dual transmission stream. The adaptation field is an area into which a turbo stream or other data is to be inserted. In detail, besides a turbo stream, reset data for initialization, a supplementary reference signal (SRS) or like training sequence, and/or the like may be inserted into the adaptation field. The adaptation field may be used as an option field in which various types of packet information is recorded. Packet information may be a program clock reference (PCR), an original program clock reference (OPCR), four circuit blocks, a splice countdown, a transport private data length, and/or an adaptation field extension length. The PCR is used for a synchronization of a demodulator of a receiver. The OPCR is used to record, reserve, and play a program in a receiver. The splice countdown is a number of consecutive macro-blocks each including Cr and Cb blocks. The transport private data length is a length of letter data of letter broadcasting. In this embodiment, an area in which a turbo stream is to be recorded may not overlap with the option field.

Figure 8:
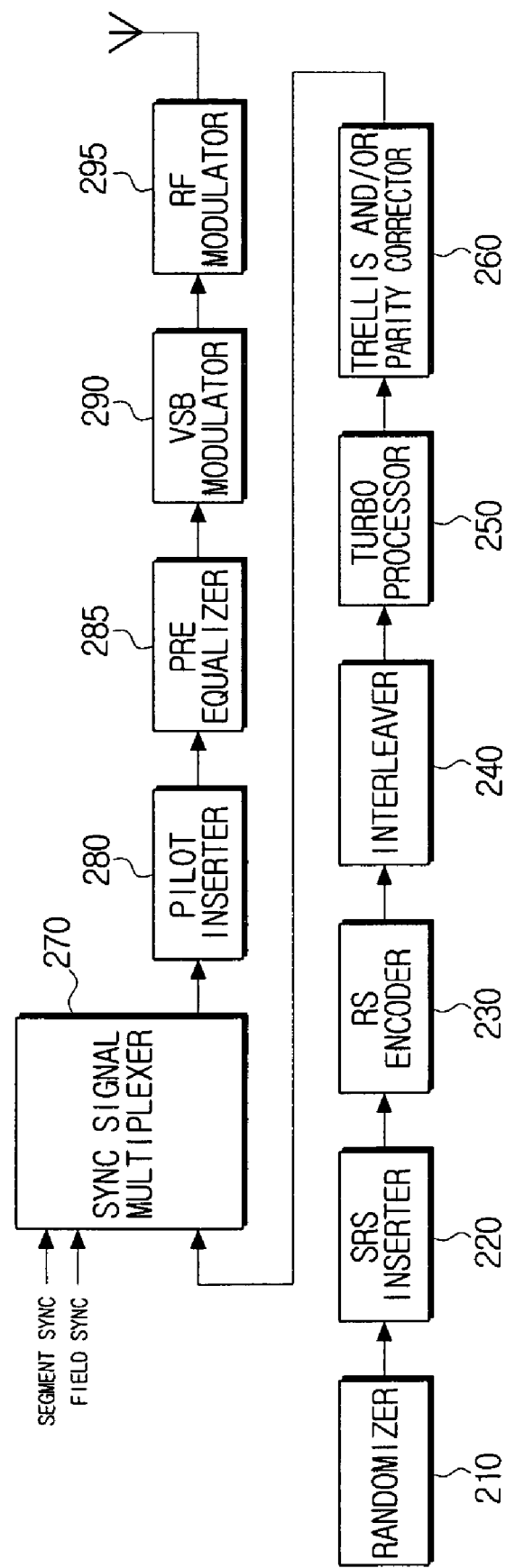
FIG. 8 is a block diagram illustrating a configuration of a transmitter of the digital broadcasting system shown in FIG. 3, according to an embodiment of the present invention.

The transmitter 200 shown in FIG. 3 may be realized as shown in FIG. 8 according to an aspect of the invention. Referring to FIG. 8, the transmitter 200 includes a randomizer 210, an SRS inserter 220, an RS encoder 230, an interleaver 240, a turbo processor 250, a trellis and/or parity corrector 260, a sync signal multiplexer 270, a pilot inserter 280, a pre-equalizer 285, a vestigial sideband (VSB) modulator 290, and an RF modulator 295. The randomizer 210 randomizes the dual transmission stream received from the transmission stream generator 100. The SRS inserter 220 receives the dual transmission stream and inserts the SRS into an adaptation field of each packet of the dual transmission stream. The SRS refers to a signal pattern commonly known to a transmitter and a receiver. A broadcasting receiver compares an SRS of a received stream with an existing SRS to easily check a state of a channel. Thus, a degree of a compensation for parity may be determined using the SRS and/or the SRS inserter 220. However, it is understood that the SRS need not be used in all aspects of the invention.

The RS encoder 230 encodes the dual transmission stream into which the SRS has been inserted. The interleaver 240 interleaves the encoded dual transmission stream. The turbo processor 250 detects only the turbo stream from the interleaved dual transmission stream, encodes and interleaves the detected turbo stream, and robustly processes the encoded and interleaved turbo stream. The robustly processed turbo stream is stuffed into the dual transmission stream to reconstitute the dual transmission stream, which includes the normal stream. Thereafter, a compensation operation is performed on parity changed by the encoding of the turbo stream. Examples of the configuration of the turbo processor 250 are shown in FIGS. 9 and 10.

Figure 9:
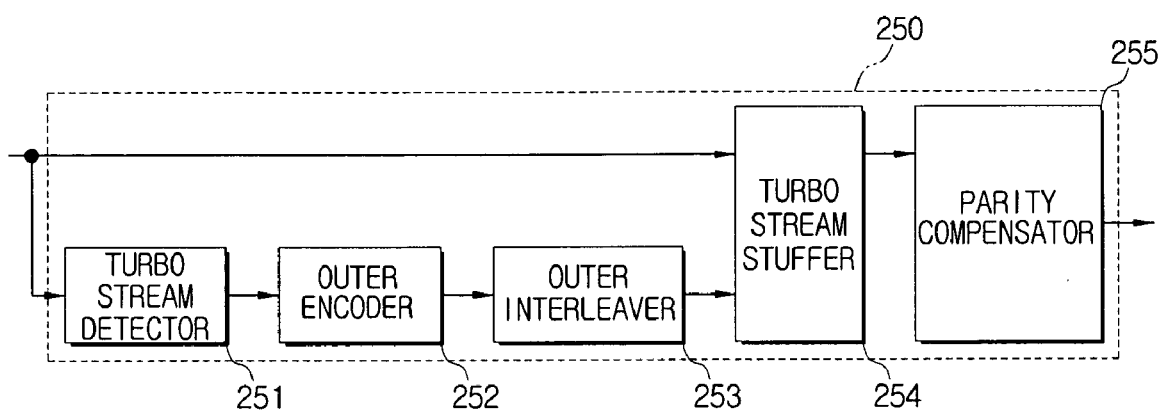
FIG. 9 is a block diagram illustrating a configuration of a turbo processor used in the transmitter shown in FIG. 8, according to an embodiment of the present invention.
Figure 10:
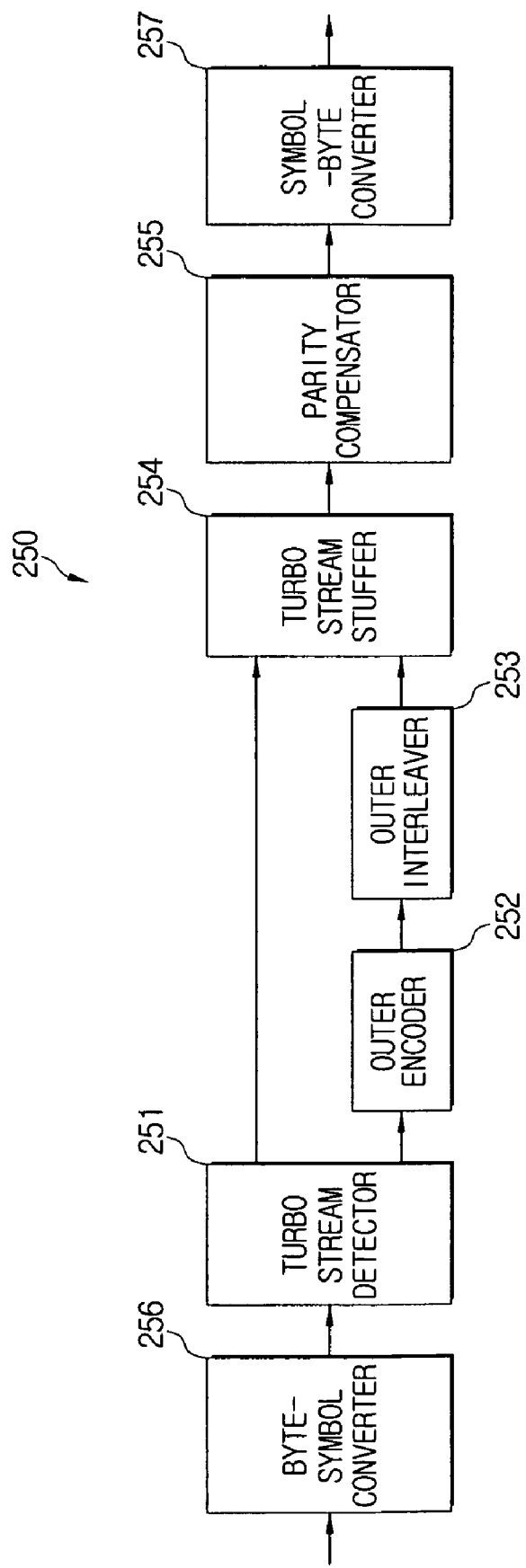
FIG. 10 is a block diagram illustrating a configuration of a turbo processor used in the transmitter shown in FIG. 8, according to an embodiment of the present invention.

Referring to FIG. 9, the turbo processor 250 includes a turbo stream detector 251, an outer encoder 252, an outer interleaver 253, a turbo stream stuffer 254, and a parity compensator 255. The turbo stream detector 251 detects the turbo stream from the dual transmission stream. The outer encoder 252 adds parity into the parity insertion area of the detected turbo stream to encode the turbo stream. The outer interleaver 253 interleaves the encoded turbo stream. The turbo stream stuffer 254 multiplexes the interleaved turbo stream and the normal stream to reconstitute the dual transmission stream. The turbo stream stuffer 254 may be realized as a multiplexer, but can be otherwise realized in other aspects of the invention. The parity compensator 255 regenerates parity of the reconstituted dual transmission stream and adds the parity to the dual transmission stream so as to compensate for a parity error caused by the encoding of the turbo stream.

However, it is understood that other byte to symbol tables can be used with or without reference to the US ATSC DTV Standards.

An example of the byte-to-symbol table of table D5.2 is as follows:

| Symbol | Segment 0 | | | Segment 1 | | | Segment 2 | | | Segment 3 | | | Segment 4 | | |
|---|---|---|---|---|---|---|---|---|---|---|---|---|---|---|---|
| | Trellis | Byte | Bits | Trellis | Byte | Bits | Trellis | Byte | Bits | Trellis | Byte | Bits | Trellis | Byte | Bits |
| 0 | 0 | 0 | 7, 6 | 4 | 208 | 5, 4 | 8 | 412 | 3, 2 | 0 | 616 | 1, 0 | 4 | 828 | 7, 6 |
| 1 | 1 | 1 | 7, 6 | 5 | 209 | 5, 4 | 9 | 413 | 3, 2 | 1 | 617 | 1, 0 | 5 | 829 | 7, 6 |
| 2 | 2 | 2 | 7, 6 | 6 | 210 | 5, 4 | 10 | 414 | 3, 2 | 2 | 618 | 1, 0 | 6 | 830 | 7, 6 |
| 3 | 3 | 3 | 7, 6 | 7 | 211 | 5, 4 | 11 | 415 | 3, 2 | 3 | 619 | 1, 0 | ... | ... | ... |
| 4 | 4 | 4 | 7, 6 | 8 | 212 | 5, 4 | 0 | 416 | 3, 2 | 4 | 620 | 1, 0 | ... | ... | ... |
| 5 | 5 | 5 | 7, 6 | 9 | 213 | 5, 4 | 1 | 417 | 3, 2 | 5 | 621 | 1, 0 | ... | ... | ... |
| 6 | 6 | 6 | 7, 6 | 10 | 214 | 5, 4 | 2 | 418 | 3, 2 | 6 | 622 | 1, 0 | ... | ... | ... |
| 7 | 7 | 7 | 7, 6 | 11 | 215 | 5, 4 | 3 | 419 | 3, 2 | 7 | 623 | 1, 0 | ... | ... | ... |
| 8 | 8 | 8 | 7, 6 | 0 | 204 | 5, 4 | 4 | 408 | 3, 2 | 8 | 612 | 1, 0 | ... | ... | ... |
| 9 | 9 | 9 | 7, 6 | 1 | 205 | 5, 4 | 5 | 409 | 3, 2 | 9 | 613 | 1, 0 | ... | ... | ... |
| 10 | 10 | 10 | 7, 6 | 2 | 206 | 5, 4 | 6 | 410 | 3, 2 | 10 | 614 | 1, 0 | ... | ... | ... |
| 11 | 11 | 11 | 7, 6 | 3 | 207 | 5, 4 | 7 | 411 | 3, 2 | 11 | 615 | 1, 0 | ... | ... | ... |
| 12 | 0 | 0 | 5, 4 | 4 | 208 | 3, 2 | 8 | 412 | 1, 0 | 0 | 624 | 7, 6 | ... | ... | ... |
| 13 | 1 | 1 | 5, 4 | 5 | 209 | 3, 2 | 9 | 413 | 1, 0 | 1 | 625 | 7, 6 | ... | ... | ... |
| ... | ... | ... | ... | ... | ... | ... | ... | ... | ... | ... | ... | ... | ... | ... | ... |
| 19 | 7 | 7 | 5, 4 | 11 | 215 | 3, 2 | 3 | 419 | 1, 0 | 7 | 631 | 7, 6 | ... | ... | ... |
| 20 | 8 | 8 | 5, 4 | 0 | 204 | 3, 2 | 4 | 408 | 1, 0 | 8 | 632 | 7, 6 | ... | ... | ... |
| 21 | 9 | 9 | 5, 4 | 1 | 205 | 3, 2 | 5 | 409 | 1, 0 | 9 | 633 | 7, 6 | ... | ... | ... |
| 22 | 10 | 10 | 5, 4 | 2 | 206 | 3, 2 | 6 | 410 | 1, 0 | 10 | 634 | 7, 6 | ... | ... | ... |
| 23 | 11 | 11 | 5, 4 | 3 | 207 | 3, 2 | 7 | 411 | 1, 0 | 11 | 635 | 7, 6 | ... | ... | ... |
| 24 | 0 | 0 | 3, 2 | 4 | 208 | 1, 0 | 8 | 420 | 7, 6 | 0 | 624 | 5, 4 | ... | ... | ... |
| 25 | 1 | 1 | 3, 2 | 5 | 209 | 1, 0 | 9 | 421 | 7, 6 | 1 | 625 | 5, 4 | ... | ... | ... |
| ... | ... | ... | ... | ... | ... | ... | ... | ... | ... | ... | ... | ... | ... | ... | ... |
| 31 | 7 | 7 | 3, 2 | 11 | 215 | 1, 0 | 3 | 427 | 7, 6 | ... | ... | ... | ... | ... | ... |
| 32 | 8 | 8 | 3, 2 | 0 | 204 | 1, 0 | 4 | 428 | 7, 6 | ... | ... | ... | ... | ... | ... |
| 33 | 9 | 9 | 3, 2 | 1 | 205 | 1, 0 | 5 | 429 | 7, 6 | ... | ... | ... | ... | ... | ... |
| 34 | 10 | 10 | 3, 2 | 2 | 206 | 1, 0 | 6 | 430 | 7, 6 | ... | ... | ... | ... | ... | ... |
| 35 | 11 | 11 | 3, 2 | 3 | 207 | 1, 0 | 7 | 431 | 7, 6 | ... | ... | ... | ... | ... | ... |
| 36 | 0 | 0 | 1, 0 | 4 | 216 | 7, 6 | 8 | 420 | 5, 4 | ... | ... | ... | ... | ... | ... |
| 37 | 1 | 1 | 1, 0 | 5 | 217 | 7, 6 | 9 | 421 | 5, 4 | ... | ... | ... | ... | ... | ... |
| ... | ... | ... | ... | ... | ... | ... | ... | ... | ... | ... | ... | ... | ... | ... | ... |
| 47 | 11 | 11 | 1, 0 | 3 | 227 | 7, 6 | ... | ... | ... | ... | ... | ... | ... | ... | ... |
| 48 | 0 | 12 | 7, 6 | 4 | 216 | 5, 4 | ... | ... | ... | ... | ... | ... | ... | ... | ... |
| 49 | 1 | 13 | 7, 6 | 5 | 217 | 5, 4 | ... | ... | ... | ... | ... | ... | ... | ... | ... |
| ... | ... | ... | ... | ... | ... | ... | ... | ... | ... | ... | ... | ... | ... | ... | ... |
| 95 | 11 | 23 | 1, 0 | ... | ... | ... | ... | ... | ... | ... | ... | ... | ... | ... | ... |
| 96 | 0 | 24 | 7, 6 | ... | ... | ... | ... | ... | ... | ... | ... | ... | ... | ... | ... |
| 97 | 1 | 25 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 767 | 11 | 191 | 1, 0 | ... | ... | ... | ... | ... | ... | ... | ... | ... | ... | ... | ... |
| 768 | 0 | 192 | 7, 6 | ... | ... | ... | ... | ... | ... | ... | ... | ... | ... | ... | ... |
| 769 | 1 | 193 | 7, 6 | ... | ... | ... | ... | ... | ... | ... | ... | ... | ... | ... | ... |
| ... | ... | ... | ... | ... | ... | ... | ... | ... | ... | ... | ... | ... | ... | ... | ... |
| 815 | 11 | 203 | 1, 0 | 3 | 419 | 7, 6 | 7 | 623 | 5, 4 | 11 | 827 | 3, 2 | ... | ... | ... |
| 816 | 0 | 204 | 7, 6 | 4 | 408 | 5, 4 | 8 | 612 | 3, 2 | 0 | 816 | 1, 0 | ... | ... | ... |
| 817 | 1 | 205 | 7, 6 | 5 | 409 | 5, 4 | 9 | 613 | 3, 2 | 1 | 817 | 1, 0 | ... | ... | ... |
| ... | ... | ... | ... | ... | ... | ... | ... | ... | ... | ... | ... | ... | ... | ... | ... |
| 827 | 11 | 215 | 7, 6 | 3 | 419 | 5, 4 | 7 | 623 | 3, 2 | 11 | 827 | 1, 0 | ... | ... | ... |

FIG. 10 is a block diagram illustrating a configuration of the turbo processor 250 according to another embodiment of the present invention. Referring to FIG. 10, the turbo processor 250 further includes a byte-symbol converter 256 and a symbol-byte converter 257 besides a turbo stream detector 251, an outer encoder 252, an outer interleaver 253, a turbo stream stuffer 254, and a parity compensator 255.

The byte-symbol converter 256 converts the dual transmission stream interleaved by the interleaver 240 from a byte unit into a symbol unit. The conversion from the byte unit into the symbol unit may be easily understood with reference to Table D5.2 of the US ATSC DTV Standards (A/53), the contents of which are incorporated herein by reference in their entirety.

The turbo stream detector 251 detects the turbo stream from the dual transmission stream which has been converted into the symbol unit. The outer encoder 252 computes parity of the detected turbo stream and inserts the parity into a parity insertion area to encode the turbo stream. In this case, the outer encoder 252 encodes the turbo stream in the unit of byte.

The outer interleaver 253 interleaves the encoded turbo stream. In this case, the outer interleaver 253 interleaves the encoded turbo stream in the unit of a bit. The turbo stream stuffer 254 multiplexes the interleaved turbo stream and the normal stream to reconstitute the dual transmission stream. In detail, the turbo stream stuffer 254 stuffs the turbo stream into an original position of the turbo stream (that is, to the position before the turbo stream is detected by the turbo stream detector 251), and constructs a dual transmission stream. The symbol-byte converter 257 converts the dual transmission stream from a symbol unit into a byte unit. The conversion from the symbol unit into the byte unit may be easily understood with reference to Table D5.2 of "US ATSC DTV Standards (A/53)" as set forth above.

Figure 11:
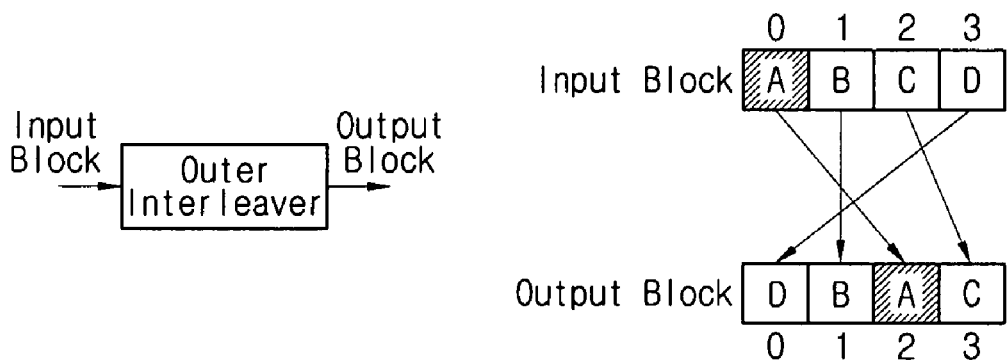
FIG. 11 is a view illustrating an operation of an outer interleaver used in a turbo processor according to an embodiment of the present invention.

FIG. 11 is a view illustrating an interleaving process performed by the outer interleaver 253 according to an aspect of the invention. Referring to FIG. 11, the outer interleaver 253 performs interleaving according to a predetermined interleaving rule. For example, the shown predetermined interleaving rule is {0, 1, 2, 3}=>{2, 1, 3, 0} and "A, B, C, and D" are sequentially input, "A, B, C, and D" are interleaved and output in the format of "DBAC." However, it is understood that other interleaving rules can be implemented.

Figure 12:
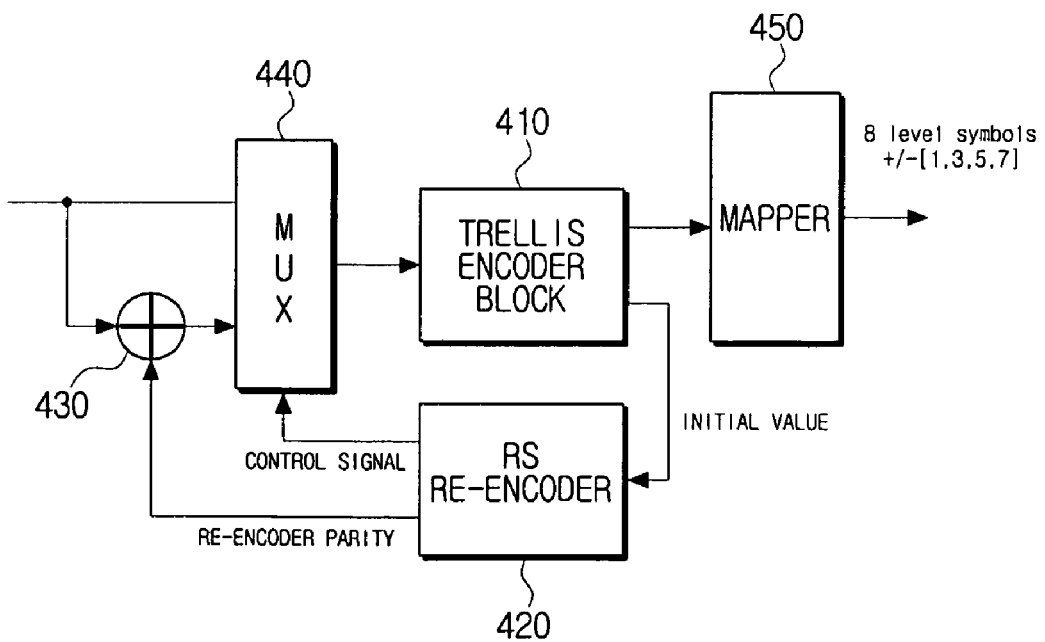
FIG. 12 is a block diagram illustrating a configuration of a trellis and/or parity corrector used in the transmitter shown in FIG. 8, according to an embodiment of the present invention.

Referring to FIG. 8, the turbo processed dual transmission stream is trellis encoded by the trellis and/or parity corrector 260. The trellis and/or parity corrector 260 also corrects parity changed by the trellis encoding. FIG. 12 is a block diagram illustrating a configuration of the trellis and/or parity corrector 260 (FIG. 8) according to an embodiment of the present invention. Referring to FIG. 12, the trellis and/or parity corrector 260 includes a trellis encoder block 410, an RS re-encoder 420, an adder 430, a multiplexer 440 and a mapper 450.

While not required in all aspects, the multiplexer 440 has an operation mode (referred to as a common mode) in which trellis encoding is performed, and an operation mode (referred to as a parity correction mode) in which a packet added by the adder 430 is trellis encoded. The operation modes of the multiplexer 440 depend on a control signal received from the RS re-encoder 420.

The trellis encoder block 410 trellis encodes a packet received from the multiplexer 440. While not required in all aspects, the trellis encoder block 410 trellis encodes the packet according to an external control signal and be initialized immediately before the SRS data of the packet is trellis encoded. The RS re-encoder 420 regenerates parity corresponding to the changed packet when the trellis encoder block 410 is initialized.

The adder 430 adds the re-encoded parity to the packet received from the turbo processor 250, and provides the addition result to the multiplexer 440. A non-limiting example of the addition method will now be described.

A) The fore is omitted . . . 101001010111 001010101011AAAAA . . . The rest is omitted.

B) The fore is omitted . . . 000000000000 010000000000BBBBB . . . The rest is omitted.

C) The fore is omitted . . . 101001010111 011010101011CCCCC . . . The rest is omitted.

A) indicates a packet received from the turbo processor 250, B) indicates an RS re-encoded packet, and C) indicates a packet obtained by performing exclusive OR on the received packet and the RS re-encoded packet using the adder 430.

When an underlined part of the received packet of A) is input to the trellis encoder block 410, the trellis encoder block 410 is initialized. In this case, a value corresponding to a value pre-stored in the trellis encoder block 410 is provided to the RS re-encoder 420, and the RS re-encoder 420 adds parity to the provided value to output the RS re-encoded packet of B). An underlined part of the RS re-encoded packet of B) means a changed value corresponding to the underlined part of the received packet of A). Parity corresponding to the underline part of the RS re-encoded packet of B) is regenerated as "BBBBB." The adder 430 performs the exclusive OR on the received packet of A) and the RS re-encoded packet of B) to output the packet of C). Considering the packet of C), the underlined part of the received packet of A) is changed into "01" in the packet of C), and parity of the received packet of A) is changed from "AAAAA" into "CCCCC" in the packet of C).

When initialization and parity correction are completed, the multiplexer 440 operates in a general operation mode to provide the dual transmission stream to the trellis encoder block 410. The mapper 450 maps the trellis encoded packet into 8-level symbols and outputs the 8-level symbols. By way of example, the map 450 may map the trellis encoded packet as shown in Table 1 below.

TABLE 1

| Z2 | Z1 | Z0 | R |
|----|----|----|----|
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

As shown in Table 1 above, Z0, Z1, and Z2 are trellis encoding values output from the trellis encoder block 410. R are mapping output values corresponding to the trellis encoding values. In other words, if the trellis encoding values are output as "0, 0, 0," the map 450 outputs "−7" as a mapping output value.

Figure 13:
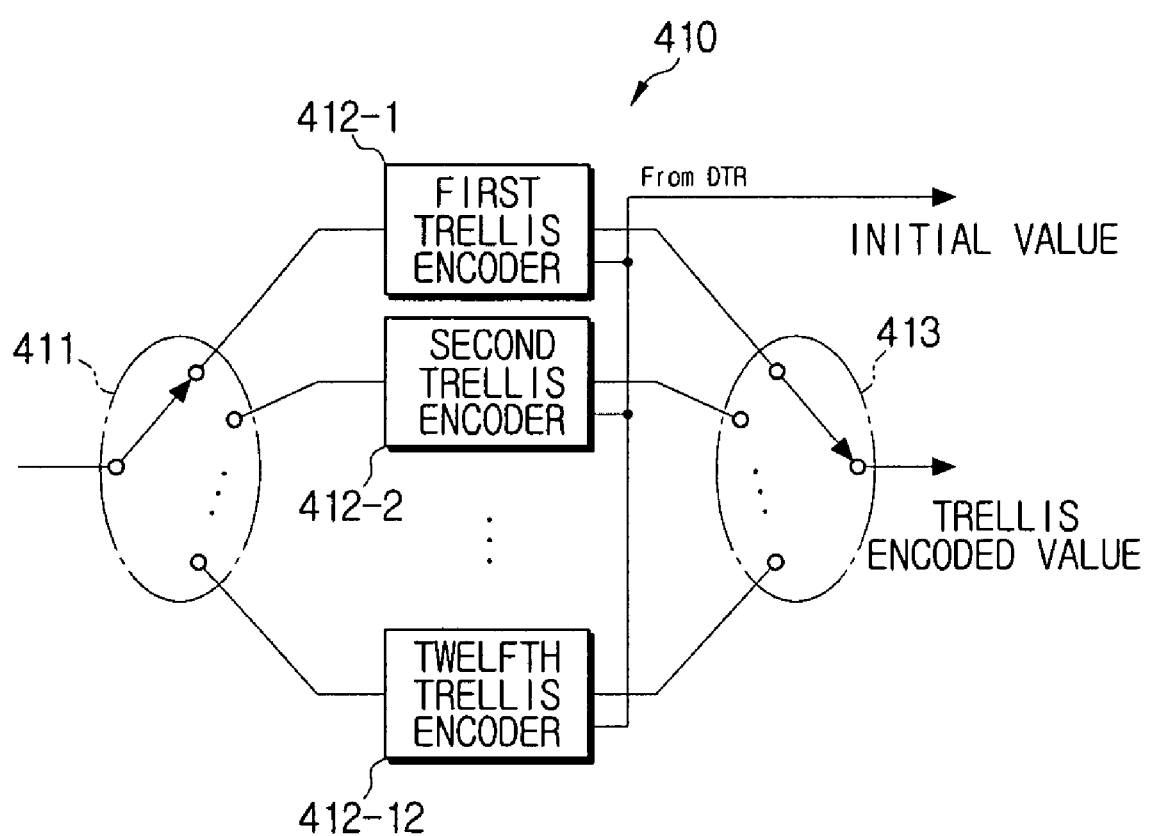
FIG. 13 is a block diagram illustrating a configuration of a trellis encoder block used in the trellis and/or parity corrector shown in FIG. 12, according to an embodiment of the present invention.

FIG. 13 is a block diagram illustrating a configuration of the trellis encoder block 410 according to an embodiment of the present invention. Referring to FIG. 13, the trellis encoder block 410 includes a splitter 411, a plurality of trellis encoders 412-1 through 412-12, and an encoding output unit 413. The splitter 411 sequentially outputs streams output from the multiplexer 440 to the plurality of trellis encoders 412-1 through 412-12. In this example, the streams may be output in the unit of byte, but can be otherwise output.

The trellis encoders 412-1 through 412-12 trellis encode and output the streams. In this case, the trellis encoders 412-1 through 412-12 are sequentially selected to sequentially output trellis encoding values of the trellis encoders 412-1 through 412-12. During an initial section, the trellis encoders 412-1 through 412-12 provide values pre-stored in memories (not shown) of the trellis encoders 412-1 through 412-12 as initial values to the RS re-encoder 420. The RS re-encoder 420 adds parity to the provided initial values and outputs the addition result to the adder 430 to correct the parity.

The encoding output unit 413 sequentially detects the trellis encoding values output from the trellis encoders 412-1 through 412-12 and outputs the trellis encoding values to the mapper 450. The trellis encoders 412-1 through 412-12 each includes a plurality of memories and perform trellis encoding using the memories. In this case, initialization is performed immediately before an area inserted with an SRS is trellis encoded. The memories are reset by the initialization. In this process, values stored in the memories are provided as initial values to the RS re-encoder 420.

In detail and while not required in all aspects, each of the trellis encoders 412-1 through 412-12 may include three memories: first through third memories. When the initialization is performed, the first memory outputs a pre-stored value as an initial value (referred to as a first initial value). Also, the third memory is initialized and simultaneously shifts a pre-stored value to the second memory. A value (referred to as a second initial value) pre-stored in the second memory is output as an initial value according to the shifting operation. The RS re-encoder 420 combines the first and second values and uses the combined value as an initial value.

The second and third memories are arranged in a line to perform shifting operations. Thus, two control signals are required to initialize the second and third memories. Also, 8 initial value states "000," "111," "001," "010," "100," "110," "101," "011" may be formed using the three memories. Values "X0" and "X1" indicating the first and second initial values may be provided to the RS re-encoder 420 to change parity.

Referring to FIG. 8, the sync signal multiplexer 270 adds a segment sync signal and a field sync signal to the trellis encoded dual transmission stream and multiplexes the dual transmission stream. The pilot inserter 280 adds a predetermined DC value to the dual transmission stream to which the segment sync signal and the field sync signal have been added to insert a pilot into the dual transmission stream. The pre-equalizer 285 equalizes the dual transmission stream into which the pilot has been inserted so as to minimize an inter-symbol interference (ISI). The VSB modulator 290 VSB modulates the equalized dual transmission stream. The RF modulator 295 modulates the VSB modulated dual transmission stream into a signal in an RF channel band and outputs the signal.

Figure 14:
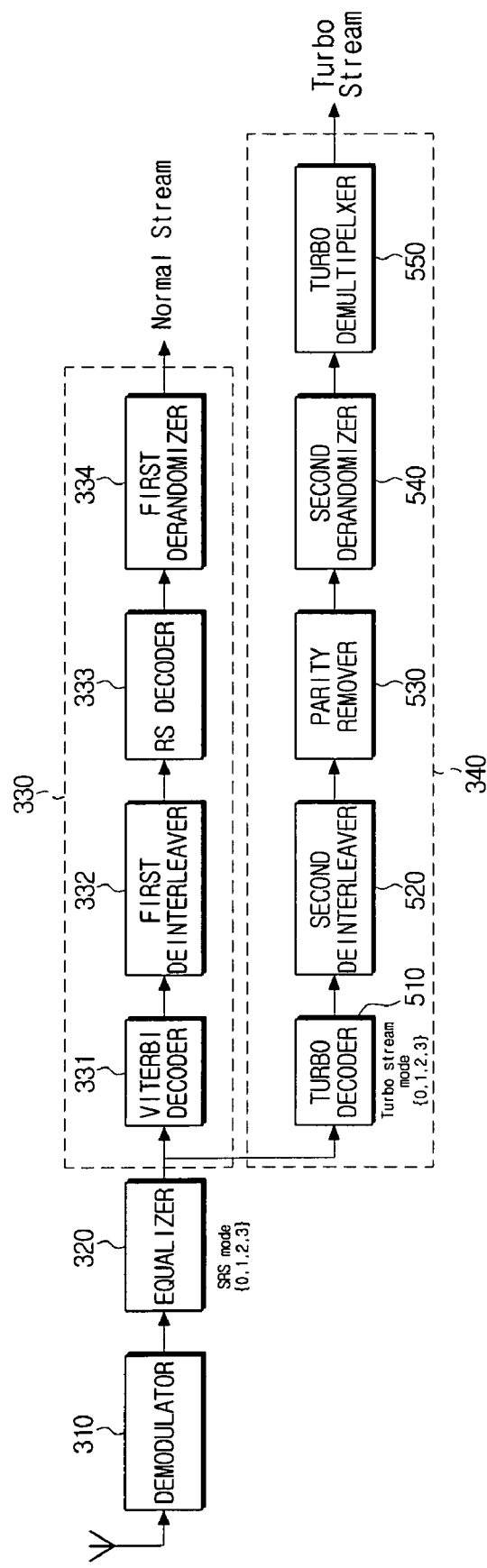
FIG. 14 is a block diagram illustrating a configuration of a receiver of the digital broadcasting system shown in FIG. 3, according to an embodiment of the present invention.

FIG. 14 is a block diagram illustrating a configuration of the receiver 300 of the digital broadcasting system shown in FIG. 3, according to an embodiment of the present invention. Referring to FIG. 14, the receiver 300 includes a demodulator 310, an equalizer 320, a first processor 330, and a second processor 340. When the demodulator 310 receives the RF-modulated dual transmission stream over, for example, an antenna, the demodulator 310 detects synchronization from the dual transmission stream according to the sync signal added to the baseband signal of the dual transmission stream. The demodulator 310 demodulates the dual transmission stream.

The equalizer 320 equalizes the demodulated dual transmission stream to compensate for a distortion of a channel caused by a multi-path of the channel. The dual transmission stream equalized by the equalizer 320 is provided to the first and second processors 330 and 340. The first processor 330 processes the normal stream of the dual transmission stream to restore normal stream data.

Referring to FIG. 14, the first processor 330 includes a viterbi decoder 331, a first deinterleaver 332, an RS decoder 333, and a first derandomizer 334. The viterbi decoder 331 performs error correction on the normal stream of the equalized dual transmission stream, decodes error corroded symbols, and outputs symbol packets. The first deinterleaver 332 deinterleaves the demodulated packets to rearrange the distributed packets. The RS decoder 333 RS decodes the deinterleaved normal stream packets to correct an error. The first derandomizer 334 derandomizes the RS decoded normal stream packets to restore the normal stream data.

The second processor 340 processes the turbo stream of the dual transmission stream to restore the turbo stream data. Referring to FIG. 14, the second processor 340 includes a turbo decoder 510, a second deinterleaver 520, a parity remover 530, a second derandomizer 540, and a turbo demultiplexer 550. The turbo decoder 510 turbo decodes only the turbo stream of the equalized dual transmission stream. Turbo decoding is a process of decoding the turbo stream. While not required, turbo decoder 510 may detect the turbo stream from a portion of the adaptation field of the dual transmission stream or the whole adaptation field and then turbo decode the turbo stream. When the turbo decoder 510 completely turbo decodes the turbo stream, the turbo decoder 510 inserts the turbo stream into the dual transmission stream to reconstitute the dual transmission stream.

The second deinterleaver 520 deinterleaves the reconstituted dual transmission stream to rearrange packets. The parity remover 530 removes the parity from the deinterleaved dual transmission stream. The second derandomizer 540 derandomizes the dual transmission stream from which the parity has been removed. The turbo demultiplexer 550 demultiplexes the derandomized dual transmission stream to restore the turbo data stream.

Figure 15:
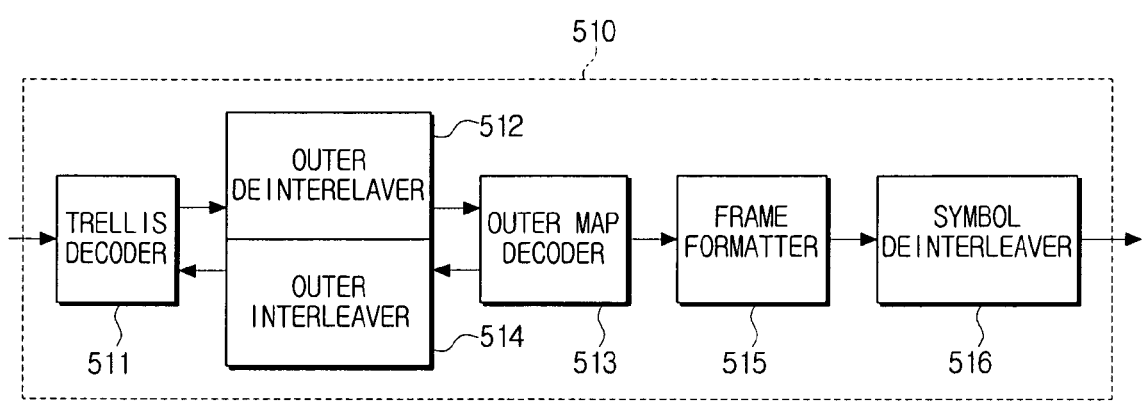
FIG. 15 is a block diagram illustrating a configuration of a turbo decoder shown in FIG. 14, according to an embodiment of the present invention.

FIG. 15 is a block diagram illustrating a configuration of the turbo decoder 510 (FIG. 14) according to an embodiment of the present invention. Referring to FIG. 15, the turbo decoder 510 includes a trellis decoder 511, an outer deinterleaver 512, an outer map decoder 513, an outer interleaver 514, a frame formatter 515, and a symbol deinterleaver 516. The trellis decoder 511 trellis decodes the turbo stream of the equalized dual transmission stream and transmits the trellis decoded turbo stream to the outer deinterleaver 512. The outer deinterleaver 512 deinterleaves the trellis decoded turbo stream.

The outer map decoder 513 convolution decodes the deinterleaved turbo stream according to an aspect of the invention. The outer map decoder 513 outputs soft decision and hard decision output values depending on the result of convolution decoding. The soft and hard decision output values depend on a matrix of the turbo stream. For example, if the matrix of the turbo stream is "0.8," the soft decision output value is output as "0.8." If the matrix of the turbo stream is "1," the hard decision output value is output. The hard decision output value of the outer map decoder 513 is provided to the frame formatter 515. In this case, the hard decision output value is the turbo stream.

The frame formatter 515 formats the convolution decoded hard decision turbo stream to a frame of the dual transmission stream to reconstitute the dual transmission stream. The symbol deinterleaver 516 may deinterleave the frame formatted turbo stream from a symbol unit to a byte unit. The deinterleaving from the symbol unit to the byte unit may be easily understood with reference to Table D5.2 of "US ATSC DTV Standards (A/53)", and thus its detailed description will be omitted. The symbol deinterleaver 516 is shown in FIG. 15, but may be omitted in other embodiments.

If the outer map decoder 513 outputs the soft decision output value, the outer interleaver 514 interleaves the turbo stream and provides the interleaved turbo stream to the trellis decoder 511. The trellis decoder 511 trellis decodes the interleaved turbo stream and provides the trellis decoded turbo stream to the outer deinterleaver 512. The outer deinterleaver 512 deinterleaves the trellis decoded turbo stream and provides the deinterleaved turbo stream to the outer map decoder 513. The operations of the trellis decoder 511, the outer deinterleaver 512, and the outer interleaver 514 may be repeatedly performed until the hard decision output value is output. Thus, a reliable decoded value can be obtained.

Figure 16:
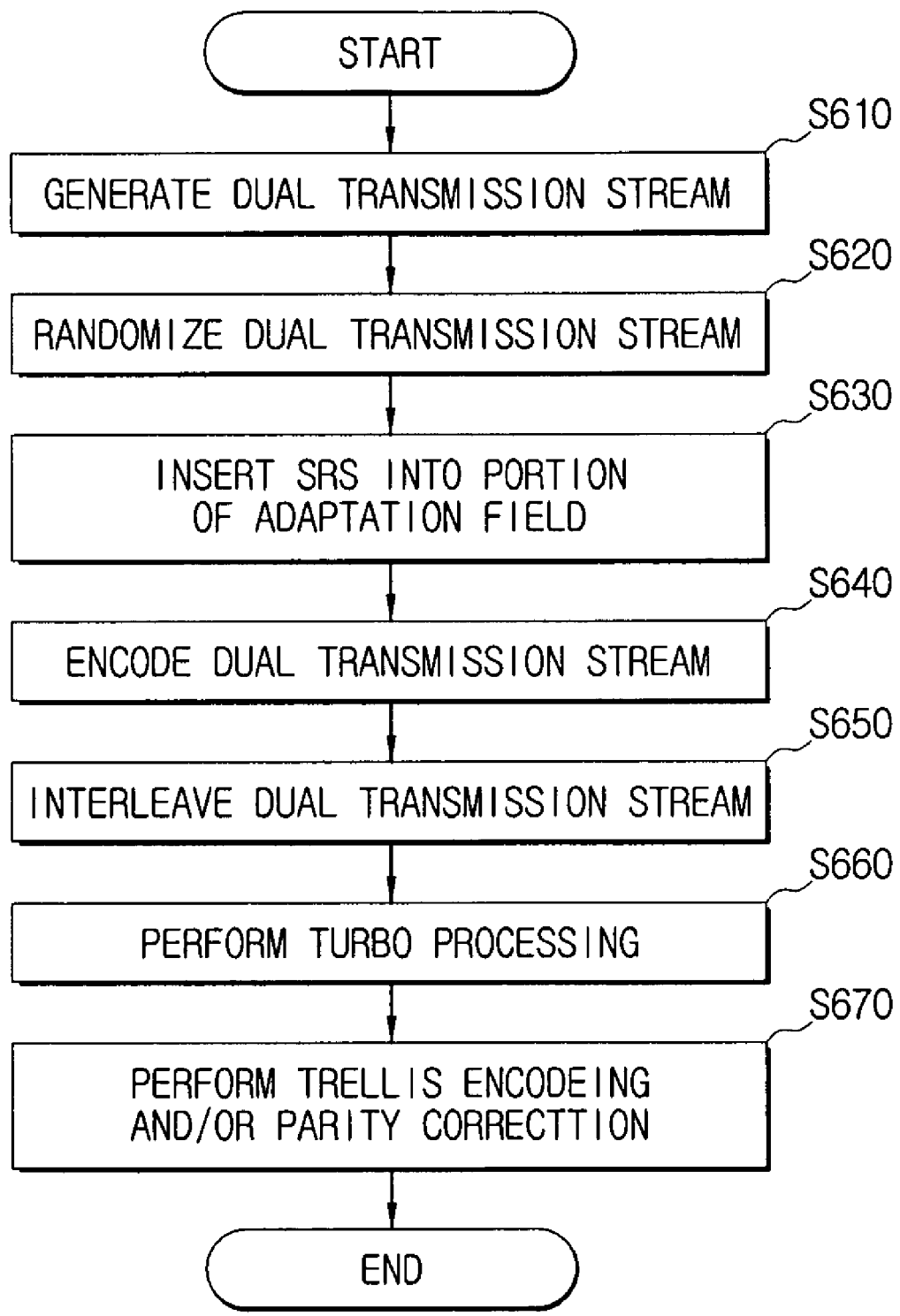
FIG. 16 is a flowchart illustrating a method of transmitting a dual transmission stream according to an embodiment of the present invention.

A digital broadcasting method according to an embodiment of the present invention includes: generating a dual transmission stream including a turbo stream and a normal stream; turbo decoding and transmitting only the turbo stream of the dual transmission stream; and receiving the dual transmission stream to separately decode the normal stream and the turbo stream so as to restore normal stream data and turbo stream data. FIG. 16 is a flowchart illustrating a method of generating and transmitting a dual transmission stream according to an embodiment of the present invention. Referring to FIG. 16, in operation S610, a dual transmission stream is generated. In detail, parity insertion areas are formed in a turbo stream, an adaptation field is formed in a normal stream, and the turbo stream and the normal stream are multiplexed to generate the dual transmission stream.

In operation S620, the dual transmission stream is randomized. In operation S630, an SRS is inserted into a portion of the adaptation field. In operation S640, the dual transmission stream into which the SRS has been inserted is encoded. In operation S650, the encoded dual transmission stream is interleaved. In operation S660, turbo processing is performed. The turbo processing generally means that only the turbo stream is detected from the dual transmission stream, encoded, interleaved, and inserted into the dual transmission stream. In this case, operation S660 is performed after operation S640. Thus, a parity compensation operation is additionally performed to prevent parity from varying with the turbo processing according to an aspect of the invention.

In operation S670, trellis encoding and/or parity correction are performed. Thereafter, a sync signal is multiplexed, a pilot is inserted into the dual transmission stream, and the dual transmission stream is equalized, modulated, and transmitted. The detailed description of this has been described above and thus will be omitted.

Figure 17:
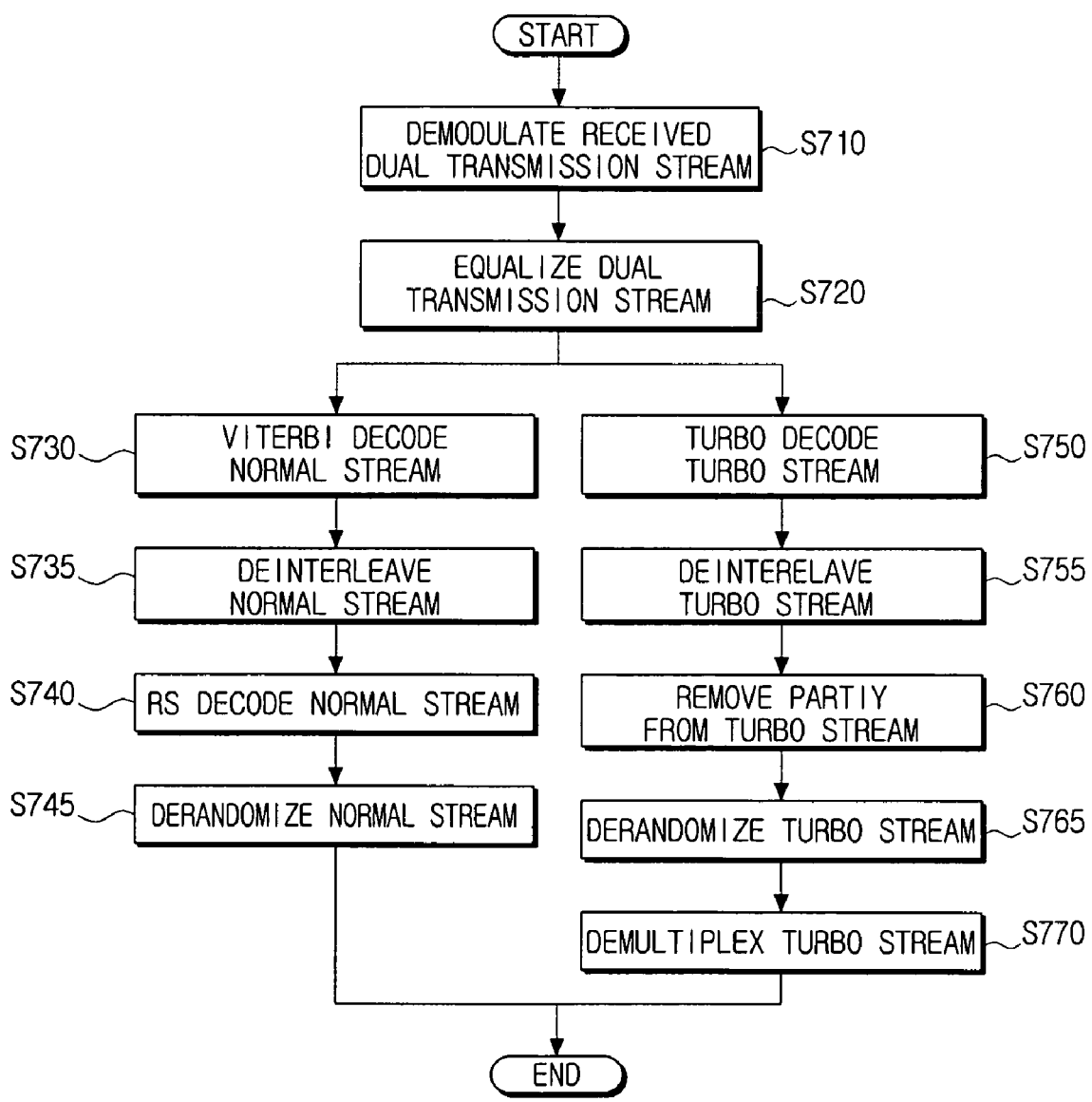
FIG. 17 is a flowchart illustrating a method of receiving a dual transmission stream according to an embodiment of the present invention.

FIG. 17 is a flowchart illustrating a method of receiving a dual transmission stream according to an embodiment of the present invention. Referring to FIG. 17, in operation S710, a dual transmission stream is received and demodulated. In operation S720, the demodulated dual transmission stream is equalized. In operation S730, a normal stream of the equalized dual transmission stream is viterbi decoded. In operation S735, the viterbi decoded normal stream is deinterleaved. In operation S740, the deinterleaved normal stream is RS decoded. In operation S745, the RS decoded normal stream is derandomized to restore normal stream data.

In operation S750, only a turbo stream of the equalized dual transmission stream is turbo decoded. In operation S755, the turbo decoded turbo stream is deinterleaved. In operation S760, parity is removed from the turbo stream. In operation S765, the turbo stream is derandomized. In operation S770, the turbo stream is detected from the derandomized dual transmission stream to demultiplex the turbo stream so as to restore turbo stream data.

Figures 18, 19:
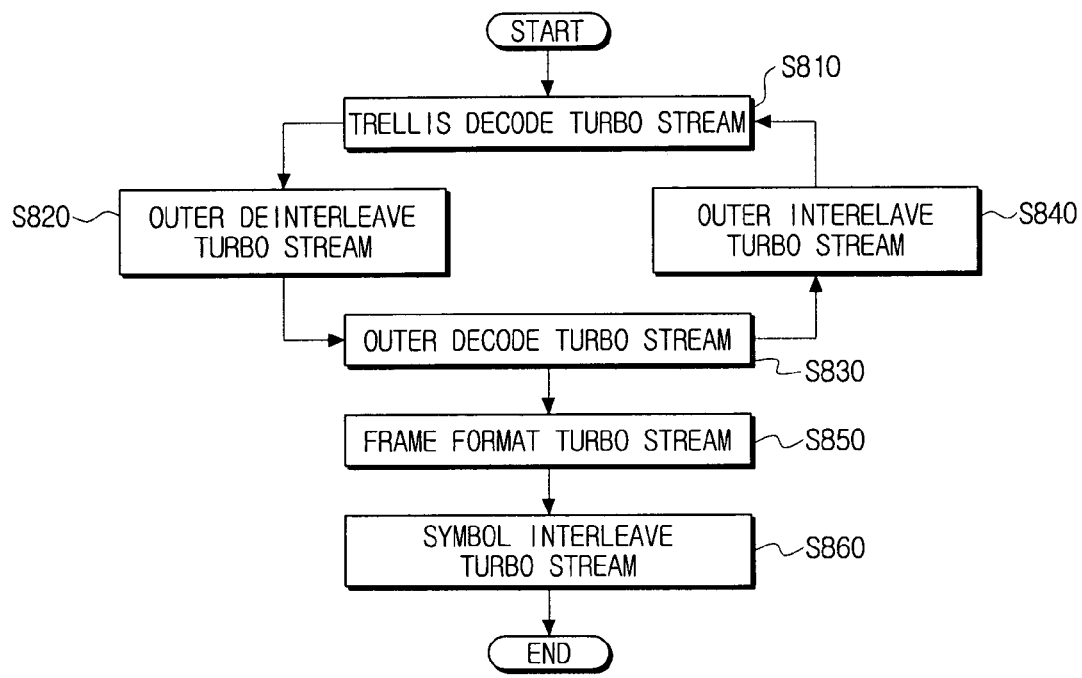
FIG. 18 is a flowchart illustrating a turbo decoding process according to an embodiment of the present invention.
FIG. 19 is a view illustrating a structure of a dual transmission stream processed by a digital broadcasting system according to an embodiment of the present invention.

FIG. 18 is a flowchart illustrating a method of decoding a turbo stream according to an aspect of the invention. Referring to FIG. 18, in operation S810, a turbo stream of a dual transmission stream is trellis decoded. In operation S820, the trellis decoded turbo stream is outer deinterleaved. In operation S830, the outer deinterleaved turbo stream is outer decoded. If a hard decision output value is output through outer decoding, the hard decision turbo stream is formatted to a frame of the dual transmission stream in operation S850. In operation S860, the turbo stream is symbol interleaved.

If a soft decision output value is output through the outer decoding, operation S840 is performed to outer interleave the trellis decoded turbo stream. Operations S810 and 820 are performed again to trellis decode and outer deinterleave the outer interleaved turbo stream. Thus, a reliable hard decision turbo stream can be obtained.

FIG. 19 is a view illustrating a structure of a dual transmission stream processed by a digital broadcasting system of an aspect of the present invention. Referring to FIG. 19, 78 turbo stream packets are inserted into 312-segment packet of one field of the dual transmission stream. In the dual transmission stream, a packet (188 bytes) of turbo streams and three packets (188 bytes) of normal streams are repeated in a ratio of 1:3. If 70 packets of turbo streams are inserted into 312 segments of the dual transmission stream, a packet of turbo streams and three packets of normal streams are repeated 70 times in a ratio of 1:3, and remaining 32 packets are constituted as normal stream packets in the dual transmission stream. An SRS having an S byte size is inserted into each packet, and thus a size of the turbo stream is 182-S bytes.

As described above, according to aspects of the present invention, a broadcasting service can be performed using a dual transmission stream including a turbo stream and a normal stream. Thus, specific data can be robustly processed and transmitted. As a result, the broadcasting service can be efficiently offered. Also, an SRS can be inserted into the dual transmission stream so that a receiver can easily check a state of a channel. Thus, a compensation degree can be determined. In particular, the above-described operations can be performed using a transmitter and the receiver having simple structures. As a result, reception performance of an ATSC VSB way as a United States terrestrial DTV system can be efficiently improved.

While not required, it is understood that aspects of the invention can be implemented using software, hardware, and combinations thereof. While described in terms of a broadcast signal sent through air or cable, it is understood that, the transmission can be made through recording on a medium for delayed playback in other aspects of the invention.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, equivalents and/or variations will be apparent to those skilled in the art.

What is claimed is:

1. A digital broadcasting system comprising:
    a transmission stream generator multiplexing a normal stream and a turbo stream to generate a dual transmission stream;
    a transmitter inserting a supplementary reference signal (SRS) into the dual transmission stream, processing the turbo stream to reconstitute the dual transmission stream, and outputting the reconstituted dual transmission stream; and
    a receiver receiving the output reconstituted dual transmission stream and separately decoding the normal stream and the turbo stream to restore normal stream data and turbo stream data.

2. The digital broadcasting system of claim 1, wherein the transmission stream generator comprises:
    a Reed-Solomon (RS) encoder receiving the turbo stream from an external source and RS encoding the turbo stream;
    a duplicator forming a parity insertion area in the RS encoded turbo stream; and
    a multiplexer receiving the normal stream from an external source and multiplexing the turbo stream processed by the duplicator and the normal stream to generate the dual transmission stream.

3. The digital broadcasting system of claim 2, wherein the duplicator converts each byte of the turbo stream using a ½ rate and/or a ¼ rate conversion method to form the parity insertion area between data bits of the turbo stream.

4. The digital broadcasting system of claim 1, wherein the transmitter comprises:
    a randomizer receiving the dual transmission stream from the transmission stream generator and randomizing the dual transmission stream;

an SRS inserter inserting the SRS into a stuff area in the randomized dual transmission stream;
an RS encoder encoding the dual transmission stream into which the SRS has been inserted;
an interleaver interleaving the RS encoded dual transmission stream;
a turbo processor detecting the turbo stream from the interleaved dual transmission stream, encoding the detected turbo stream, stuffing the encoded turbo stream into the dual transmission stream, and compensating for parity corresponding to the encoded turbo stream; and
a trellis and/or parity corrector trellis encoding the dual transmission stream processed by the turbo processor.

5. The digital broadcasting system of claim 4, wherein the turbo processor comprises:
a turbo stream detector detecting the turbo stream from the interleaved dual transmission stream;
an outer encoder inserting parity corresponding to the detected turbo stream into a parity insertion area of the turbo stream;
an outer interleaver interleaving the turbo stream into which the parity has been inserted;
a turbo stream stuffer inserting the interleaved turbo stream into the dual transmission stream to reconstitute the dual transmission stream; and
a parity compensator regenerating parity of the reconstituted dual transmission stream and adding the parity to the dual transmission stream.

6. The digital broadcasting system of claim 5, wherein the turbo processor further comprises:
a byte-symbol converter converting the interleaved dual transmission stream from a byte unit into a symbol unit; and
a symbol-byte converter converting the dual transmission stream comprising the parity regenerated by the parity compensator from a symbol unit into a byte unit.

7. The digital broadcasting system of claim 4, wherein the transmitter further comprises:
a multiplexer adding a sync signal to the trellis encoded dual transmission stream;
a pilot inserter inserting a pilot into the dual transmission stream to which the sync signal has been added;
a pre-equalizer equalizing the dual transmission stream into which the pilot has been inserted;
a VSB modulator VSB modulating the equalized dual transmission stream; and
a radio frequency (RF) modulator modulating the VSB modulated dual transmission stream into a signal in an RF channel band and transmitting the signal.

8. The digital broadcasting system of claim 4, wherein the trellis and/or parity corrector performs an initialization before encoding the SRS and compensates for the parity according to a value changed by the initialization.

9. The digital broadcasting system of claim 8, wherein the trellis and/or parity corrector comprises:
a trellis encoder block performing the initialization and outputting pre-stored value as an initial value when an external control signal corresponding to an initialization section is received;
an RS re-encoder generating parity corresponding to the initial value;
an adder adding the parity generated by the RS re-encoder to the dual transmission stream to correct parity of the dual transmission stream;
a multiplexer providing the dual transmission stream comprising the parity corrected by the adder to the trellis encoder block; and a mapper symbol mapping and outputting the dual transmission stream trellis encoded by the trellis encoder block.

10. The digital broadcasting system of claim 9, wherein the trellis encoder block comprises:
a plurality of trellis encoders;
a splitter sequentially inputting the dual transmission stream into the plurality of trellis encoders; and
an encoding output unit sequentially detecting values encoded by the plurality of trellis encoders.

11. The digital broadcasting system of claim 10, wherein each of the plurality of trellis encoders comprises:
a first memory initialized and outputting a pre-stored value as a first initial value when the external control signal is input;
a second memory; and
a third memory initialized to shift a pre-stored value to the second memory so as to output the value pre-stored in the second memory as a second initial value when the external control signal is input,
wherein the RS re-encoder generates parity corresponding to an initial value comprising a combination of the first and second initial values.

12. The digital broadcasting system of claim 1, wherein the receiver comprises:
a demodulator receiving and demodulating the output dual transmission stream;
an equalizer equalizing the demodulated dual transmission stream;
a first processor restoring the normal stream data from the equalized dual transmission stream; and
a second processor restoring the turbo stream data from the equalized dual transmission stream.

13. The digital broadcasting system of claim 12, wherein the first processor comprises:
a viterbi decoder performing error correction on the normal stream of the equalized dual transmission stream and decoding the error corrected normal stream;
a first deinterleaver deinterleaving the dual transmission stream output from the viterbi decoder;
an RS decoder RS decoding the deinterleaved dual transmission stream; and
a first derandomzer derandomizing the RS decoded dual transmission stream to restore the normal stream data.

14. The digital broadcasting system of claim 12, wherein the second processor comprises:
a turbo decoder turbo decoding the turbo stream of the equalized dual transmission stream;
a second deinterleaver deinterleaving the dual transmission stream comprising the turbo decoded turbo stream;
a parity remover removing parity from the dual transmission stream deinterleaved by the second deinterleaver;
a second derandomizer derandomizing the dual transmission stream from which the parity has been removed; and
a turbo demultiplexer demultiplexing the derandomized dual transmission stream to restore the turbo stream data.

15. The digital broadcasting system of claim 14, wherein the turbo decoder comprises:
a trellis decoder trellis decoding the turbo stream of the equalized dual transmission stream;
an outer deinterleaver deinterleaving the trellis decoded turbo stream to output a soft decision value and a hard decision value;
an outer map decoder decoding the deinterleaved turbo stream;

an outer interleaver interleaving the turbo stream decoded by the outer map decoder and providing the interleaved turbo stream to the trellis decoder when the outer map decoder outputs the soft decision output value; and a frame formatter frame formatting the hard decision output value output from the outer map decoder.

16. The digital broadcasting system of claim 15, wherein the turbo decoder further comprises a symbol deinterleaver converting the frame formatted turbo stream from a symbol unit into a byte unit and providing the turbo stream to the turbo inserter.

17. The digital broadcasting system of claim 3, wherein:
the duplicator converts each byte of the turbo stream using the ½ rate conversion method to form four pairs of bits within each byte,
each pair includes one parity insertion area and a corresponding bit of the turbo stream, and
for each pair, the one parity insertion area is in a first bit position of the pair.

18. The digital broadcasting system of claim 3, wherein:
the duplicator converts each byte of the turbo stream using the ½ rate conversion method to form four pairs of bits within each byte,
each pair includes one parity insertion area and a corresponding bit of the turbo stream, and
for each pair, the one parity insertion area is in a second bit position of the pair.

19. The digital broadcasting system of claim 3, wherein:
the duplicator converts each byte of the turbo stream using the ¼ rate conversion method to form two groups of four bits within each byte,
each group includes one parity insertion area of three bits and a corresponding bit of the turbo stream, and
for each group, the one parity insertion area is in first through third bit positions of the group.

20. The digital broadcasting system of claim 3, wherein:
the duplicator converts each byte of the turbo stream using the ¼ rate conversion method to form two groups of four bits within each byte,
each group includes one parity insertion area of three bits and a corresponding bit of the turbo stream, and
for each group, the one parity insertion area is in second through fourth bit positions of the group.

21. The digital broadcasting system of claim 4, wherein the transmission stream generator further comprises a multiplexer the multiplexes the normal and turbo streams, and forms the stuff area into which the SRS is inserted.

22. The digital broadcasting system of claim 21, wherein:
the stuff area comprises an adaptation field added by the multiplexer into each packet of the dual transport stream, and
ones of the adaptation fields not including the stuff area comprises an option field selectable between and individually indicating a program clock reference (PCR), an original program clock reference (OPCR), four circuit blocks, a splice countdown, a transport private data length, and/or an adaptation field extension length.

23. The digital broadcasting system of claim 2, wherein the transmitter comprises:
a randomizer receiving the dual transmission stream from the transmission stream generator and randomizing the dual transmission stream;
an SRS inserter inserting the SRS into a stuff area in the randomized dual transmission stream;
an RS encoder encoding the dual transmission stream into which the SRS has been inserted;

an interleaver interleaving the RS encoded dual transmission stream;
a turbo processor detecting the turbo stream from the interleaved dual transmission stream, encoding the detected turbo stream, stuffing the encoded turbo stream into the dual transmission stream, and compensating for parity corresponding to the encoded turbo stream; and
a trellis and/or parity corrector trellis encoding the dual transmission stream processed by the turbo processor.

24. The digital broadcasting system of claim 23, wherein the turbo processor comprises:
a turbo stream detector detecting the turbo stream from the interleaved dual transmission stream;
an outer encoder inserting parity corresponding to the detected turbo stream into the parity insertion area of the turbo stream created by the duplicator;
an outer interleaver interleaving the turbo stream into which the parity has been inserted;
a turbo stream stuffer inserting the interleaved turbo stream into the dual transmission stream to reconstitute the dual transmission stream; and
a parity compensator regenerating parity of the reconstituted dual transmission stream and adding the parity to the dual transmission stream.

25. The digital broadcasting system of claim 2, wherein:
prior to RS encoding, the turbo stream comprises a sync signal, a packet identity area, and a turbo stream area, and
the RS encoder strips the sync signal from the received turbo stream and inserts a parity into the turbo stream while RS encoding the turbo stream to enlarge the turbo stream.

26. The digital broadcasting system of claim 25, wherein:
prior to RS encoding, the turbo stream is 188 bytes including 1 byte for the sync signal, 3 bytes for the packet identity area, and 184 bytes for the turbo stream area, and
after RS encoding, the turbo stream is 207 bytes including 20 bytes for the parity, 3 bytes for the packet identity area, and 184 bytes for the turbo stream area.

27. A digital broadcasting method of a digital broadcasting system, the method comprising:
multiplexing a normal stream and a turbo stream by a transmission stream generator of the digital broadcasting system to generate a dual transmission stream;
inserting, by a transmitter of the digital broadcasting system, a supplementary reference signal (SRS) into the generated dual transmission stream, processing the turbo stream by the transmitter, to reconstitute the dual transmission stream, and outputting the reconstituted dual transmission stream by the transmitter; and
receiving the reconstituted dual transmission stream from the transmitter and decoding the normal stream and the turbo stream to restore normal stream data and turbo stream data.

28. The digital broadcasting method of claim 27, wherein the multiplexing of the normal stream and the turbo stream to generate the dual transmission stream comprises:
receiving the turbo stream from an external source and Reed-Solomon (RS) encoding the turbo stream;
forming a parity insertion area in the RS encoded turbo stream; and
receiving the normal stream from an external source and multiplexing the turbo stream comprising the parity insertion area and the normal stream to generate the dual transmission stream.

29. The digital broadcasting method of claim 28, wherein each byte of the turbo stream is converted using a ½ rate conversion method and/or ¼ rate conversion method to form the parity insertion area between data bits of the turbo stream.

30. The digital broadcasting method of claim 27, wherein the inserting of the SRS into the dual transmission stream, processing the turbo stream to reconstitute the dual transmission stream, and the outputting of the reconstituted dual transmission stream comprises:
randomizing the generated dual transmission stream;
inserting the SRS into a stuff area formed in the randomized dual transmission stream;
encoding the dual transmission stream into which the SRS has been inserted;
interleaving the encoded dual transmission stream;
detecting the turbo stream from the interleaved dual transmission stream, encoding the turbo stream, stuffing the encoded turbo stream into the dual transmission stream, and compensating for parity corresponding to the encoded turbo stream; and
trellis encoding the turbo processed dual transmission stream.

31. The digital broadcasting method of claim 30, wherein the detecting of the turbo stream from the interleaved dual transmission stream, the encoding of the turbo stream, the stuffing of the encoded turbo stream into the dual transmission stream, and the compensating for the parity corresponding to the encoded turbo stream comprises:
detecting the turbo stream from the interleaved dual transmission stream;
inserting parity corresponding to the detected turbo stream into a parity insertion area of the turbo stream;
interleaving the turbo stream into which the parity has been inserted;
inserting the interleaved turbo stream into the dual transmission stream to reconstitute the dual transmission stream; and
regenerating parity of the reconstituted dual transmission stream and adding the parity to the dual transmission stream.

32. The digital broadcasting method of claim 31, wherein the detecting of the turbo stream from the interleaved dual transmission stream, the encoding of the turbo stream, the stuffing of the encoded turbo stream into the dual transmission stream, and the compensating for the parity corresponding to the encoded turbo stream further comprises:
converting the interleaved dual transmission stream from a byte unit into a symbol unit; and
converting the dual transmission stream comprising the regenerated parity from a symbol unit into a byte unit.

33. The digital broadcasting method of claim 30, wherein the inserting of the SRS into the dual transmission stream, processing the turbo stream to reconstitute the dual transmission stream, and the outputting of the reconstituted dual transmission stream further comprises:
adding a sync signal to the trellis encoded dual transmission stream;
inserting a pilot into the dual transmission stream to which the sync signal has been added;
equalizing the dual transmission stream into which the pilot has been inserted;
VSB modulating the equalized dual transmission stream; and
modulating the VSB modulated dual transmission stream into a signal in an RF channel band and transmitting the signal.

34. The digital broadcasting method of claim 30, wherein an initialization is performed before the SRS is encoded and the parity is compensated for according to a value changed by the initialization.

35. The digital broadcasting method of claim 27, wherein the receiving of the reconstituted dual transmission stream and the decoding of the normal stream and the turbo stream to restore the normal stream data and the turbo stream data comprises:
receiving and demodulating the dual transmission stream;
equalizing the demodulated dual transmission stream;
restoring the normal stream data from the equalized dual transmission stream; and
restoring the turbo stream data from the equalized dual transmission stream.

36. The digital broadcasting method of claim 35, wherein the restoring of the normal stream data from the equalized dual transmission stream comprises:
performing error correction on the normal stream of the equalized dual transmission stream and decoding the error corrected normal stream;
deinterleaving the demodulated dual transmission stream;
RS decoding the deinterleaved dual transmission stream; and
derandomizing the RS decoded dual transmission stream to restore the normal stream data.

37. The digital broadcasting method of claim 35, wherein the restoring of the turbo stream data from the equalized dual transmission stream comprises:
turbo decoding the turbo stream of the equalized dual transmission stream;
deinterleaving the dual transmission stream comprising the turbo decoded turbo stream;
removing parity from the deinterleaved dual transmission stream;
derandomizing the dual transmission stream from which the parity has bee removed; and
demultiplexing the derandomized dual transmission stream to restore the turbo stream data.

38. The digital broadcasting method of claim 37, wherein the turbo decoding of the turbo stream of the equalized dual transmission stream comprises:
trellis decoding the turbo stream of the equalized dual transmission stream using a trellis decoder;
deinterleaving the trellis decoded turbo stream;
decoding the deinterleaved turbo stream to output a soft decision output value or a hard decision output value;
when the soft decision output value is output, interleaving the decoded turbo stream and providing the interleaved turbo stream to the trellis decoder;
when the hard decision output value is output, frame formatting the hard decision output value to output the dual transmission stream.

39. The digital broadcasting method of claim 38, wherein the turbo decoding of the turbo stream of the equalized dual transmission stream further comprises converting the frame formatted turbo stream from a symbol unit into a byte unit.

40. A digital broadcasting system comprising:
a transmitter inserting a training sequence into a dual transmission stream comprising a normal stream multiplexed with a turbo stream, processing the turbo stream to reconstitute the dual transmission stream, and outputting the reconstituted dual transmission stream; and
a receiver receiving the output reconstituted dual transmission stream, comparing the training sequence in the received dual transmission stream with a training sequence stored in the receiver, and separately decoding the normal stream and the turbo stream to restore normal stream data and turbo stream data.

41. The digital broadcasting system of claim 40, wherein the training sequence comprises a supplementary reference signal (SRS).

42. The digital broadcasting system of claim 40, wherein the transmitter comprises:

a training sequence inserter inserting the training sequence into a stuff area in the dual transmission stream;

a Reed-Solomon (RS) encoder encoding the dual transmission stream into which the training sequence has been inserted;

an interleaver interleaving the training sequence encoded dual transmission stream;

a turbo processor detecting the turbo stream from the interleaved dual transmission stream, encoding the detected turbo stream, stuffing the encoded turbo stream into the dual transmission stream, and compensating for parity corresponding to the encoded turbo stream; and a trellis and/or parity corrector trellis encoding the dual transmission stream processed by the turbo processor.

43. The digital broadcasting system of claim 42, wherein the turbo processor comprises:

a turbo stream detector detecting the turbo stream from the interleaved dual transmission stream;

an outer encoder inserting parity corresponding to the detected turbo stream into a parity insertion area of the turbo stream;

an outer interleaver interleaving the turbo stream into which the parity has been inserted;

a turbo stream stuffer inserting the interleaved turbo stream into the dual transmission stream to reconstitute the dual transmission stream; and a parity compensator regenerating parity of the reconstituted dual transmission stream and adding the parity to the dual transmission stream.

44. The digital broadcasting system of claim 42, wherein:

the stuff area comprises an adaptation field added into each packet of the dual transport stream while multiplexing the normal and turbo streams, and ones of the adaptation fields not including the stuff area comprises an option field selectable between and individually indicating a program clock reference (PCR), an original program clock reference (OPCR), four circuit blocks, a splice countdown, a transport private data length, and/or an adaptation field extension length.

45. The digital broadcasting system of claim 42, wherein the trellis and/or parity corrector comprises:

a trellis encoder block performing an initialization and outputting pre-stored value as an initial value when an external control signal corresponding to an initialization section is received;

an RS re-encoder generating parity corresponding to the initial value;

an adder adding the parity generated by the RS re-encoder to the dual transmission stream to correct parity of the dual transmission stream;

a multiplexer providing the dual transmission stream comprising the parity corrected by the adder to the trellis encoder block; and a mapper symbol mapping and outputting the dual transmission stream trellis encoded by the trellis encoder block.

46. The digital broadcasting system of claim 45, wherein the trellis encoder block comprises:

a plurality of trellis encoders;

a splitter sequentially inputting the dual transmission stream into the plurality of trellis encoders; and an encoding output unit sequentially detecting values encoded by the plurality of trellis encoders.

47. The digital broadcasting system of claim 46, wherein each of the plurality of trellis encoders comprises:

a first memory initialized and outputting a pre-stored value as a first initial value when the external control signal is input;

a second memory; and a third memory initialized to shift a pre-stored value to the second memory so as to output the value pre-stored in the second memory as a second initial value when the external control signal is input, wherein the RS re-encoder generates parity corresponding to an initial value comprising a combination of the first and second initial values.

* * * * *